USO10340451B2

(12) United States Patent
Tada et al.

(10) Patent No.: US 10,340,451 B2
(45) Date of Patent: Jul. 2, 2019

(54) SWITCHING ELEMENT HAVING OVERLAPPED WIRING CONNECTIONS AND METHOD FOR FABRICATING SEMICONDUCTOR SWITCHING DEVICE

(71) Applicant: NEC CORPORATION, Tokyo (JP)

(72) Inventors: Munehiro Tada, Tokyo (JP); Toshitsugu Sakamoto, Tokyo (JP); Naoki Banno, Tokyo (JP); Koichiro Okamoto, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 14/655,920

(22) PCT Filed: Jan. 15, 2014

(86) PCT No.: PCT/JP2014/000138
§ 371 (c)(1),
(2) Date: Jun. 26, 2015

(87) PCT Pub. No.: WO2014/112365
PCT Pub. Date: Jul. 24, 2014

(65) Prior Publication Data
US 2015/0340606 A1  Nov. 26, 2015

(30) Foreign Application Priority Data
Jan. 18, 2013 (JP) ................. 2013-007349

(51) Int. Cl.
H01L 45/00 (2006.01)
H01L 27/24 (2006.01)
G11C 13/00 (2006.01)

(52) U.S. Cl.
CPC ........ *H01L 45/126* (2013.01); *G11C 13/0002* (2013.01); *H01L 27/2418* (2013.01);
(Continued)

(58) Field of Classification Search
CPC ... H01L 27/2427; H01L 45/06; H01L 45/141; H01L 45/1246; H01L 45/1273; H01L 45/1253
(Continued)

(56) References Cited

U.S. PATENT DOCUMENTS 7,961,506 B2 * 6/2011 Liu .................... G11C 13/0004
365/148
2004/0114428 A1    6/2004 Morikawa
(Continued)

FOREIGN PATENT DOCUMENTS

JP    2004-186553 A    7/2004
JP    2007-514265 A    5/2007
(Continued)

OTHER PUBLICATIONS

Munehiro Tada et al., "Polymer Solid-Electrolyte Switch Embedded on CMOS for Nonvolatile Crossbar Switch", IEEE Transactions on Electron Devices, Dec. 2011, pp. 4398-4405, vol. 58, No. 12.
(Continued)

*Primary Examiner* — David Chen
(74) *Attorney, Agent, or Firm* — Sughrue Mion, PLLC

(57) ABSTRACT

In switching elements each using a two-terminal-type variable resistance element, improper writing or any improper operation is often caused and the reliability of the switching elements cannot be improved easily. A switching element according to the present invention is equipped with a first variable resistance element equipped with a first input/output terminal and a first connection terminal, a second variable resistance element equipped with a second input/output terminal and a second connection terminal, and a rectifying element equipped with a control terminal and a third connection terminal, wherein the first connection terminal, the second connection terminal and the third connection terminal are connected to one another.

14 Claims, 22 Drawing Sheets

(52) U.S. Cl.
CPC ...... *H01L 27/2436* (2013.01); *H01L 27/2472* (2013.01); *H01L 45/04* (2013.01); *H01L 45/085* (2013.01); *H01L 45/1233* (2013.01); *H01L 45/1266* (2013.01); *H01L 45/146* (2013.01); *H01L 45/1675* (2013.01); *H01L 45/1683* (2013.01); *G11C 2213/15* (2013.01); *G11C 2213/78* (2013.01); *H01L 27/2427* (2013.01); *H01L 45/06* (2013.01); *H01L 45/1273* (2013.01)

(58) Field of Classification Search
USPC ....... 257/2, 4, 5, E45.001, E45.002; 365/63, 365/148, 163, 185.05
See application file for complete search history.

(56) References Cited

U.S. PATENT DOCUMENTS

| | | | |
|---|---|---|---|
| 2007/0159867 A1 | 7/2007 | Muraoka et al. | |
| 2010/0246241 A1* | 9/2010 | Seko | G11C 5/063 365/148 |
| 2011/0284817 A1* | 11/2011 | Sasago | H01L 27/1021 257/5 |
| 2013/0082231 A1 | 4/2013 | Tada et al. | |
| 2013/0121063 A1 | 5/2013 | Tsuji et al. | |
| 2013/0181180 A1* | 7/2013 | Tada | G11C 13/0007 257/1 |

FOREIGN PATENT DOCUMENTS

| | | |
|---|---|---|
| JP | 2010-153591 A | 7/2010 |
| JP | 2010-287789 A | 12/2010 |
| JP | 2011-172084 A | 9/2011 |
| JP | WO 2012043502 A1 * | 4/2012 ......... G11C 13/0007 |
| WO | 2011/158821 A1 | 12/2011 |
| WO | 2012/042828 A1 | 4/2012 |

OTHER PUBLICATIONS

International Search Report of PCT/JP2014/000138 dated Mar. 4, 2014 [PCT/ISA/210].

Communication dated Jul. 4, 2017, issued from the Japan Patent Office in counterpart Application No. 2014-557401.

* cited by examiner

SWITCHING ELEMENT HAVING OVERLAPPED WIRING CONNECTIONS AND METHOD FOR FABRICATING SEMICONDUCTOR SWITCHING DEVICE

CROSS REFERENCE TO RELATED APPLICATIONS

This application is a National Stage of International Application No. PCT/JP2014/000138, filed Jan. 15, 2014, claiming priority based on Japanese Patent Application No. 2013-007349, filed Jan. 18, 2013, the contents of all of which are incorporated herein by reference in their entirety.

TECHNICAL FIELD

The present invention relates to a switching element and a method for fabricating a semiconductor switching device and, in particular, to a switching element including a non-volatile variable resistance element and a method for fabricating a semiconductor switching device including a non-volatile variable resistance element.

BACKGROUND ART

Semiconductor devices (in particular, silicon devices) have been increased in the scale of integration and fourfold in every three years by miniaturization (a scaling law called Moore's Law) and reduced in power consumption. In recent years, the gate lengths of MOSFETs (Metal Oxide Semiconductor Field Effect Transistors) are 20 nm or less. Because of rising costs for lithography processes (equipment prices and mask set prices) and the physical limits of device scaling (operating limits and the variation limits), there has been need for improvement in the performance of highly integrated devices through an approach other than the miniaturization following the scaling law.

Rewritable programmable logic devices, called field programmable gate array (FPGA), which stand midway between gate arrays and standard cell arrays, have been developed in recent years. An arbitrary circuit configuration can be programmed on the FPGA by a user after manufacture of the chip. The FPGA has variable resistance elements inside a multilevel-wiring layer so that the user can make arbitrary electrical connections of wirings. The use of a semiconductor device containing such an FPGA can improve the flexibility of the circuit.

Examples of variable resistance elements include MRAM (Magneto-resistive Random Access Memory), PRAM (Phase Change RAM), and ReRAM (Resistance Random Access Memory). Additionally, there are CBRAM (Conductive Bridging RAM, which is a RAM based on a conductive path using ions in a solid electrolyte) and the like. The operating principles of the memories will be described below.

MRAM makes use of the property of a ferromagnetic material that magnetism generated in the ferromagnetic material by an externally applied magnetic field remains in the ferromagnetic material after removal of the external magnetic field. An MRAM cell uses a structure in which two ferromagnetic layers are stacked with an insulator between the two layers. The magnetization direction of one (fixed layer) of the two ferromagnetic layers is used as a reference magnetization direction and the magnetization direction of the other magnetic layer (free layer) is changed in accordance with data to be stored. Magnetic resistance varies depending on whether the magnetization directions of the two ferromagnetic layers are the same or not. The use of the fact that the value of current flowing through a memory element varies depending on difference in magnetic resistance is used to store data.

Accordingly, to write data, the magnetization direction of the magnetic layer (the free layer) for data storage is set in accordance with the data to be stored to determine the direction of a magnetic field externally applied to the magnetic layer for data storage (the free layer).

"Spin injection magnetization reversal" is being used as a method for writing data on an MRAM. In this method, spin torque applied from a invariable magnetization layer (fixed layer) by direct passage of electrical current through a structure in which two magnetic layers are stacked with an insulating film between the two layers is used to reverse the magnetization direction of free magnetization layer (free layer).

PRAM makes use of the property of a phase-change material that changes to a crystalline state (a lower resistance state) or to an amorphous state (a higher resistance state) in response to an externally applied electrical current, thereby changing its resistance value. A PRAM cell uses a structure having a phase-change layer disposed between two electrodes. The resistivity of the PRAM cell significantly varies depending on the difference between the two phases, crystalline and amorphous phases, of a "variable resistance film" made of the phase-change material. Data is stored in the memory cell by using the fact that current flowing through the memory element varies according to the difference in resistivity between two phases, the crystalline and amorphous phases. A data write determines a current value and a pulse width that causes a phase change from the "low-resistance crystalline state" to the "high-resistance amorphous state" or from the "high-resistance amorphous state" to the "low-resistance crystalline state" in accordance with the data to be stored. This sets the variable resistance film in the "low-resistance crystalline state" or the "high-resistance amorphous state".

Typical phase-change materials are chalcogenide alloys and a chalcogenide alloy of germanium, antimony and tellurium ($Ge_2Sb_2Te_5$) is representative. Such a phase-change material ($Ge_2Sb_2Te_5$) is generally referred to as "GST".

When the GST in the "low-resistance crystalline state" is heated to a temperature higher than 600° C., the GST loses its crystallinity and, when the GST is subsequently cooled, the GST changes its phase to the "high-resistance amorphous state". On the other hand, when the GST in the "high-resistance amorphous state" is heated to a temperature higher than or equal to the crystallization temperature and lower than the melting point and the heating state is maintained, "recrystallization" develops and the GST returns to the "low-resistance crystalline state".

In the PRAM, the phase-change material (GST) in the "low-resistance crystalline state" represents "1" and the state is referred to as the "set state" whereas the phase-change material (GST) in the "high-resistance amorphous state" represents "0" and the state is referred to as the "reset state".

To rewrite from the "reset state" to the "set state", i.e. to cause a phase change from the "high-resistance amorphous state" to the "low-resistance crystalline state", a relatively small current is passed for a long time as a set programing current pulse. Since the phase-change material in the "high-resistance amorphous state" exhibits a high resistance value, even a "small current" can generate Joule heat required for heating the phase change material to the crystallization temperature or higher and the state can be maintained to facilitate "recrystallization", thereby returning the GST to the "low-resistance crystalline state".

To rewrite from the "set state" to the "reset state", i.e. to cause a phase change from the "low-resistance crystalline state" to the "high-resistance amorphous state", a relatively large current is passed for a short time as a reset programming current pulse. Since the GST in the "low-resistance exhibits a small resistance value, a "large current" is passed to generate Joule heat required for heating to a high temperature higher than 600° C. When the temperature reaches a high temperature exceeding 600° C., the phase change to the "high-resistance amorphous state" is facilitated and whereby the resistance value rapidly rises therefore the current pulse width is set to a short duration to avoid a rapid increase in Joule heat generated.

In PRAM, programming is determined by amplitude regardless of the direction in which current flows and therefore the PRAM can be classified as a bipolar variable resistance element.

ReRAM makes use of the property that a resistance value varies in accordance with whether a conductive path is formed inside a variable resistance film by an externally applied voltage and current to place the ReRAM in the on state or the conductive path formed in the variable resistance film is removed to place the ReRAM in the off state. The ReRAM cell uses a structure that has a variable resistance film disposed between two electrodes. For example, an electric field is applied to form a filament in the variable resistance film made of a metal oxide or a conductive path is formed between the two electrodes to place the ReRAM cell in the on state. On the other hand, then an electric field is applied in the reverse direction to remove the filament or the conductive path formed between the two electrodes to place the ReRAM cell in the off state. The direction of the electric field applied is reversed to make switching between the on and off states where the resistance value between the two electrodes significantly differ. Data is stored by making use of the fact that current flowing through the memory element varies according to the difference in resistance value between the on state and off state. To write data, a voltage value, a current value and a pulse width are chosen such that a transition from the off state to the on state or a transition from the on state to the off state occurs in accordance with data to be stored. This generates or removes a filament for storing data or forms or removes a conductive path.

Non Patent Literature 1 (NPL1) discloses an example of a variable resistance element that is likely to improve the flexibility of a "circuit" used for configuring "memory cells" of ReRAM, among variable resistance elements used for configuration of ReRAM. The variable resistance element uses, metallic ion migration in an ion conductor, "deposition of metal by reduction of metallic ions" and "generation of metallic ions by oxidation of metal" due to electrochemical reactions. Thus the variable resistance element is a nonvolatile switching element that reversibly changes the resistance value between electrodes that sandwich a variable resistance film to make switching. The nonvolatile switching element disclosed in the Non Patent Literature 1 (NPL1) is made up of a "solid electrolyte" made of an ion conductor and a "first electrode" and a "second electrode" each of which is provided on each of the two sides of the "solid electrolyte". A "first metal" that forms the "first electrode" of the nonvolatile switching element and a "second metal" that forms the "second electrode" differ from each other in standard Gibbs energy of formation $\Delta G$ in the process of metal oxidization or metallic ion generation.

In the nonvolatile switching element disclosed in the Non Patent Literature 1 (NPL1), the "first metal" that forms the "first electrode" and the "second metal" that forms the "second electrode" are chosen as follows.

Consider a case where a "bias voltage" which causes a transition from the off state to the on state is applied between the "first electrode" and the "second electrode". A metal that can be oxidized by electrochemical reaction induced by the "bias voltage" applied at the interface between the "first electrode" and the "solid electrolyte" to generate metallic ions and can supply the metallic ions to the "solid electrolyte" is used as the "first metal" that forms the "first electrode".

Consider a case where when the "bias voltage" that causes a transition from the on state to the off state is applied between the "first electrode" and the "second electrode", the "first metal" is deposited on the surface of the "second electrode. The "first metal" deposited on the "second electrode" is oxidized by electrochemical reaction induced by the applied "bias voltage" to generate metallic ions, which dissolve in the "solid electrolyte" as metallic ions. A metal that does not induce the process of metal oxidization and metallic ion generation in some "bias voltage" applied is used as the "second metal" that forms the "second electrode".

A switching operation in a metal-bridging variable resistance element that achieves an on state and an off state by "formation of a metal bridge structure" and "dissolution of the metal bridge structure" will be described below.

In the process of transition from the off state to the on state (the set process), the second electrode is grounded and a positive voltage is applied to the first electrode. At this point, the metal of the first electrode ionizes at the interface between the first electrode and the solid electrolyte and the metallic ions dissolve in the solid electrolyte. On the second electrode side, on the other hand, metallic ions in the solid electrolyte are deposited as metal in the solid electrolyte by using electrons supplied from the second electrode. The metal deposited in the solid electrolyte forms a metal bridge structure and eventually a metal bridge that interconnects the first electrode and the second electrode is formed. The electrical interconnection between the first electrode and the second electrode by the metal bridge places the switch in the on state.

On the other hand, in the transition process (the reset process) from the on state to the off state, when the second electrode of the switch in the on state is grounded and a negative voltage is applied to the first electrode, the metal of the metal bridge ionizes and the metallic ions dissolve into the solid electrolyte. As the dissolution progresses, a portion of the "metal bridge structure" that forms the metal bridge breaks. The metal bridge interconnecting the first electrode and the second electrode eventually breaks and the electrical connection is disconnected to places the switch in the off state.

Note that as the dissolution of the metal progresses, the "metal bridge structure" that forms the conducting path becomes thinner and the resistance between the first electrode and the second electrode increases. Additionally, the dissolved metallic ions at the interface between the first electrode and the solid electrolyte are reduced and separate out as metal and therefore the concentration of metallic ions contained in the "solid electrolyte" decreases to change the specific permittivity. With this change, electric characteristics, such as capacitance between the electrodes, change before the electrical connection is completely disconnected, and then eventually the electrical connection is disconnected.

When the second electrode of the metal-bridging variable resistance element placed in the off state (reset) is grounded again and a positive voltage is applied again to the first electrode, the transition process from the off state to the on state (the set process) proceeds. In other words, in the metal-bridging variable resistance element, the transition process from the off state to the on state (the set process) and the transition process from the on state to the off state (the reset process) can be reversibly made.

The Non Patent Literature 1 (NPL1) further discloses a configuration of a two-terminal switching element in which two electrodes are disposed with an ion conductor between them for controlling conduction state between the two electrodes, and a switching operation of the switching element.

As embedded memories, on the other hand, a volatile eDRAM (embedded Dynamic Random Access Memory), a nonvolatile flash memory and the like are used. The eDRAM loses stored information when power is removed from it. The flash memory requires a high voltage (5 V or higher). Accordingly, embedded memories have problems, including the problem that they are unsuitable for being embedded in a logic LSI (Large Scale Integrated circuit) which operates at a low voltage (1 V or lower).

(Definition of Polarity of Variable Resistance Element)

Operating characteristics of variable resistance elements that are applicable to the present invention can be classified as unipolar type, which performs resistance varying operation with the level of an applied voltage regardless of the operation principle described above, or bipolar type, which performs resistance varying operation with the level of an applied voltage and voltage polarity.

<Unipolar Variable Resistance Element>

Operating characteristics of a unipolar variable resistance element will be described with reference to FIGS. 15A to 15D. For example, a unipolar variable resistance element including a first electrode, a variable resistance element and a second electrode transitions from an off state (high-resistance state) to an on state (low-resistance state) at a desired set voltage as the threshold voltage when a positive voltage is applied to the first electrode (FIG. 15A). The threshold voltage depends on the thickness, composition, density and the like of a variable resistance film. Then, when a positive voltage is applied again to the first electrode of the variable resistance element in the on state (FIG. 15B), the variable resistance element transitions from the on state to the off state at a desired threshold voltage (reset voltage). As the application of the positive voltage is continued, the set voltage is reached and the variable resistance element transitions again from the off state to the on state.

On the other hand, when a negative voltage is applied to the first electrode (FIG. 15C), the variable resistance element transitions from the off state (high-resistance state) to the on state (low-resistance state) at a desired set voltage as the threshold voltage. Then, when the positive voltage is applied again to the first electrode of the variable resistance element in the on state (FIG. 15D), the variable resistance element transitions from the on state to the off state at a desired threshold voltage (reset voltage).

An element in which the operation in FIGS. 15A-15B and the operation in FIGS. 15C-15D are symmetric and that exhibits resistance variation characteristics that are not dependent on voltage application direction (polarity) but instead is dependent only on the level of voltage is defined as a unipolar variable resistance element.

<Bipolar Variable Resistance Element>

A bipolar solid electrolyte switch element is a switch element that requires voltages of opposite polarities for switching between an off state (high-resistance state) and an on state (low-resistance state). Operating characteristics of a typical bipolar variable resistance element will be described with reference to FIGS. 16A to 16D.

When a positive voltage is applied to a first electrode of a bipolar variable resistance element including the first electrode, a variable resistance element, and a second electrode, for example (FIG. 16A), the bipolar variable resistance element transitions from the off state (high-resistance state) to the on state (low-resistance state) at a desired set voltage as the threshold voltage. Then, when the positive voltage is applied again to the first electrode of the variable resistance element in the on state (FIG. 16B), the variable resistance element exhibits ohmic current-voltage characteristics.

On the other hand, when a negative voltage is applied to the first electrode (FIG. 16C), transitions occurs from the on state (low-resistance state) to the off state (high-resistance state) at a desired set voltage as the threshold voltage. However, when the positive voltage is applied again to the first electrode of the variable resistance element in the on state (FIG. 16D), transition from the on state to the off state does not occur at a voltage higher than or equal to the desired threshold voltage (set voltage).

An element that
  transitions from the off state to the on state only when a
    positive voltage is applied to the first electrode, and
  transitions from the on state to the off state only when a
    negative voltage is applied to the first electrode
as described above is defined as a bipolar variable resistance element.

<Definition of Electrode of Bipolar Variable Resistance Element>

Electrodes used in a bipolar variable resistance element will be defined here. An electrode that transitions from the off state to the on state when a positive voltage is applied as described with reference to FIGS. 16A to 16D is defined as a "first electrode" or an "active electrode".

<Description of Solid Electrolyte Layer-Based Variable Resistance Element>

As an example of the bipolar variable resistance element described above, the Non Patent Literature 1 (NPL1) discloses a switching element that makes use of metal ion migration in a solid electrolyte layer (a solid in which ions can freely move in response to application of an electric field or the like) and electrochemical reaction. The switching element disclosed in the Non Patent Literature 1 (NPL1) includes three layers: a solid electrolyte layer, a first electrode disposed on one side of the solid electrolyte layer, and a second electrode disposed on the other side of the solid electrolyte layer so that the electrodes are opposed to each other. The first electrode acts as a supplier of metallic ions to the solid electrolyte layer. The second electrode does not supply metallic ions.

An operation of the switching element will be briefly described below.

When the first electrode is grounded and a negative voltage is applied to the second electrode, the metal of the first electrode ionizes and the metallic ions dissolve into the solid electrolyte layer. Metallic ions in the solid electrolyte layer are then deposited in the solid electrolyte layer as metal. The metal deposited in the solid electrolyte layer forms a metal bridge which interconnects the first electrode and the second electrode. The metal bridge electrically interconnects the first electrode and the second electrode to place the switching element in the on state.

On the other hand, when the first electrode of the switching element in the on state is grounded and a positive voltage is applied to the second electrode, a portion of the metal bridge breaks. As a result, the electrical connection between the first electrode and the second electrode is disconnected to place the switching element in the off state. Note that electric characteristics, such as capacitance between the electrodes, change before the electrical connection is completely disconnected, and then eventually the electrical connection is disconnected.

To cause a transition from the off state to the on state, the first electrode is grounded and a negative voltage is applied to the second electrode.

As a switching element implemented by a solid electrolyte layer-based variable resistance element, the Non Patent Literature 1 (NPL1) discloses a configuration and operation of a two-terminal switching element in which first and second electrodes are disposed with a solid electrolyte layer between the electrodes and conduction between the electrodes are controlled.

A switching element implemented by such a solid electrolyte layer-based variable resistance element is smaller in size and on-resistance than semiconductor switches such as MOSFETs. Accordingly, such switching elements are considered to be promising for application to programmable logic devices.

Furthermore, the conduction state (on or off state) of the switching element is maintained after the applied voltage is removed. Accordingly, the switching element may be used as a nonvolatile memory element. For example, a plurality of memory cells each of which includes one selector element such as a transistor and one switching element are arranged in columns and rows. Such an arrangement enables selection of any of the plurality of memory cells using a word line and a bit line. Thus, a nonvolatile memory can be implemented in which the conduction state of the switching element of the selected memory cell can be sensed to read information indicating which of "0" and "1" is stored in the memory cell from the on or off state of the switching element.

Note that the Non Patent Literature 1 (NPL1) discloses a configuration including a first electrode, a second electrode, a variable resistance element connecting to both of the first and second electrodes, and a control electrode connecting to the variable resistance element through a dielectric layer. The dielectric layer is in contact with a side surface of the variable resistance element.

Patent Literature 2 (PTL2) discloses a semiconductor integrated circuit in which a first variable resistance element, a second variable resistance element and a first switching element are connected in series between a first power supply and a second power supply.

CITATION LIST

Patent Literature

[PTL1] Japanese Laid-Open Patent No. 2010-153591
[PTL2] Japanese Laid-Open Patent No. 2011-172084

Non Patent Literature

[NPL1] M. Tada, K. Okamoto, T. Sakamoto, M. Miyamura, N. Banno, and H. Hada, "Polymer Solid-Electrolyte (PSE) Switch Embedded on CMOS for Nonvolatile Crossbar Switch", IEEE TRANSACTION ON ELECTRON DEVICES, Vol. 58, No. 12, pp. 4398-4405, (2011).

SUMMARY OF INVENTION

Technical Problem

The related art described above will be analyzed below.

Consider a case in which two-terminal variable resistance elements as described above are formed on a semiconductor device and programed. For example, if the technique is applied to a switch that selects the destination of a signal line in a nonvolatile manner, a control signal line for programing and a signal line that transmits a signal through a variable resistance element that has been placed in the on state after programming are not independent of each other. Therefore there is a problem that programing is difficult to control and prone to falls operations.

The present invention has been completely newly made in order to solve the problem. A major object of the present invention is to provide a switching element and a method for fabricating a semiconductor switching device that solve the above-described problem that a switching element using a two-terminal variable resistance element is prone to false writes and false operations, making it difficult to achieve high reliability.

Solution to Problem

A switching element according to the present invention includes a first variable resistance element including a first input/output terminal and a first connection terminal, a second variable resistance element including a second input/output terminal and a second connection terminal; and a rectifying element including a control terminal and a third connection terminal. The first connection terminal, the second connection terminal and the third connection terminal are interconnected.

A method for fabricating a semiconductor switching device according to the present invention is a method for fabricating a semiconductor switching device including a bipolar variable resistance element in a multilevel-copper-wiring layer on a semiconductor substrate. The method includes the steps of forming an insulating barrier film on a first electrode/copper wiring, and forming an opening communicating with the first electrode/copper wiring and having a wall surface becoming wider with distance from the copper wiring. The method further includes the steps of forming a variable resistance film on an entire surface including the opening; forming a second electrode on the variable resistance film, forming a rectifying element on the second electrode, and forming a third electrode on the rectifying element.

Advantageous Effect of Invention

A switching element of the present invention is capable of preventing false writes and false operations of variable resistance elements and improving the reliability.

DESCRIPTION OF EMBODIMENTS

Before describing specific exemplary embodiments and examples of the present invention, the concept of the present invention will be described.

<First Aspect: Switching Element Including Two Variable Resistance Elements and One Rectifying Element>

Figure 1:
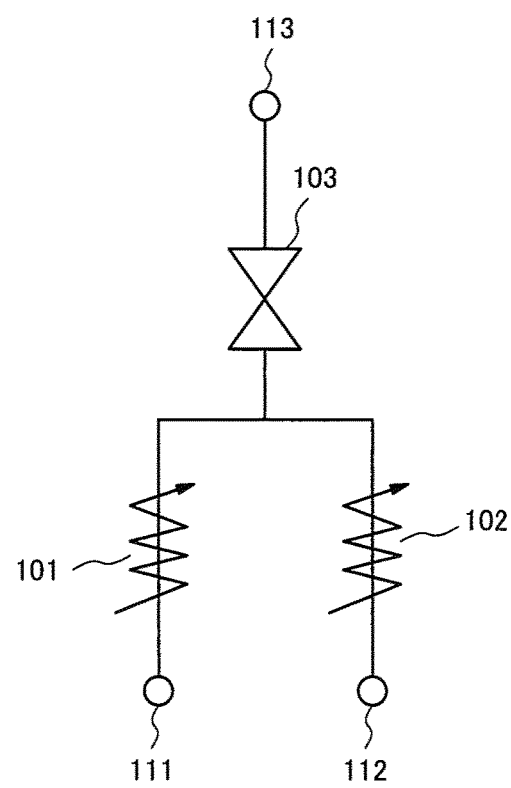
FIG. 1 is an equivalent circuit diagram of a switching element according to a first exemplary embodiment of the present invention.

Referring to FIG. 1, in one aspect of the present invention, a switching element of the present invention includes a first variable resistance element (101), a second variable resistance element (102), and a rectifying element (103) and includes a first terminal (111), a second terminal (112) and a third terminal (113).

Resistance state of the first variable resistance element (101) can be changed by applying a voltage between the first terminal (111) and the third terminal (control terminal) (113). Resistance state of the second variable resistance element can be changed by applying a voltage between the second terminal (112) and the third terminal (control terminal) (113).

When a voltage equal to or less than a programing voltage is applied to the third terminal (113), the rectifying element (103) insulates and separates the third terminal (113) from the first variable resistance element (101) and the second variable resistance element (102). Accordingly, the third terminal (113) is separated from a logic signal/read signal that propagates between the first electrode (101) and the second electrode (102). In this way, signals are transmitted through the two variable resistance elements and the variable resistance elements are programmed through the rectifying element.

According to an exemplary embodiment of the present invention described above, a control signal line for programming and a signal line (or read line) which is connected after the programing can be made independent of each other by applying a voltage through the rectifying element (103). This can prevent false writes and false operations of the variable resistance elements.

Figure 2A:
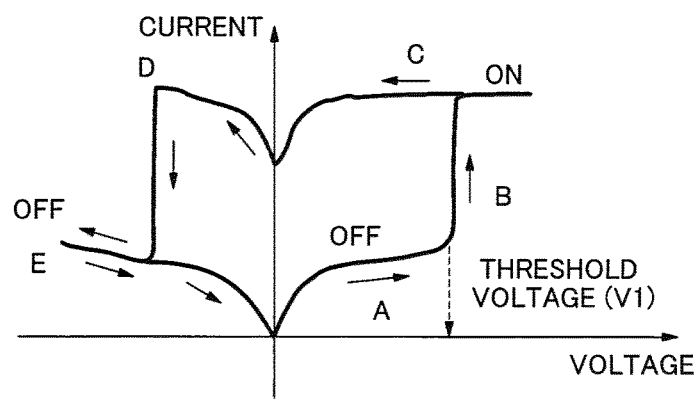
FIG. 2A is a graph illustrating current-voltage characteristics of a variable resistance element making up a switching element according to the first exemplary embodiment of the present invention.

Operating characteristics of the variable resistance elements and the rectifying elements in this case will be described by taking bipolar types as an example. FIG. 2A illustrates current-voltage characteristics of a bipolar variable resistance element, and FIG. 2B illustrates current-voltage characteristics of a bipolar rectifying element.

When a positive voltage is applied to the first electrode of the variable resistance element, leak current gradually increases (A in FIG. 2A) and, after a threshold voltage (V1) is exceeded, a transition occurs from a high-resistance state (off state) to a low-resistance state (on state) (B). Even when the voltage is reduced back to 0V, the low-resistance state is maintained (C). Then, when a negative voltage is applied to the first electrode, a transition occurs from the low-resistance state (on state) to the high-resistance state (off state) (D) after a given peak current is reached. Even when the negative voltage is further applied, the resistance does not change (E) because the variable resistant element is of the bipolar type.

Figure 2B:
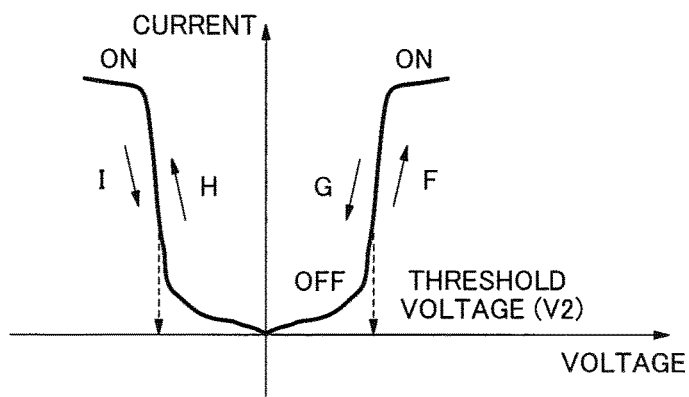
FIG. 2B is a graph illustrating current-voltage characteristics of a rectifying element making up the switching element according to the first exemplary embodiment of the present invention.

In the rectifying element, when a positive voltage is applied to the first electrode, leak current gradually increases and, after a threshold voltage (V2) is exceeded, a transition occurs from a high-resistance state (off state) to a low-resistance state (on state) (F in FIG. 2B). As the voltage is reduced back to 0 V, the current value decreases (G) after the voltage decreases below the threshold voltage because the resistance state is volatile. On the other hand, when a voltage is applied in the opposite direction, leak current gradually increases and, after the threshold voltage (V2) is exceeded, a transition occurs from the high-resistance state (off state) to the low-resistance state (on state) (H). When the voltage is decreased back to 0V, the current value decreases (I) after the voltage decreases below the threshold voltage, because the resistance state is volatile.

At this point, the voltage applied between the first terminal (111) and the third terminal (113) is divided between the first variable resistance element and the rectifying element (103). To change (program) the resistance state of the variable resistance element from the off state to the on state with a smaller control voltage, it is preferable that much of the applied control voltage be applied to the variable resistance element.

Accordingly, it is preferable that in the off state, the level of leak current of the rectifying element is lower than that of the variable resistance element.

Therefore, the threshold voltage (V2) of the rectifying element (103) and the threshold voltage (V1) of the first and second variable resistance elements are preferably in the relationship V1>V2.

The first variable resistance element, the second variable resistance element, and the rectifying element preferably have the same in operating polarity. In other words, if bipolar variable resistance elements are used, preferably a bipolar rectifying element (bidirectional rectifying element) is used; if unipolar variable resistance elements are used, preferably a unipolar rectifying element (unidirectional rectifying element) is used. This is because the bipolar variable resistance elements make switching according to the magnitude and direction of current and accordingly the rectifying element needs to have characteristics of the same polarity.

<Second Aspect: Device Structure>

In a second aspect of the present invention, a preferable example of a switching element formed on a semiconductor device substrate will be described. A variable resistance element including a first electrode which serves as a source of metallic ions, a second electrode which is less likely to ionize than the first electrode, and a solid electrolyte which is provided between the first electrode and the second electrode and is capable of conducting the metallic ions is used. A semiconductor device can be implemented in which at least two such variable resistance elements are provided and the first electrodes or the second electrodes of the two variable resistance elements are interconnected and disposed electrically in series.

The variable resistance elements are formed in a multi-level-wiring layer of the semiconductor device and the first electrodes serve both of lower electrodes and wirings. Preferably, an insulating barrier film provided between the first electrodes and the solid electrolyte has an opening and the variable resistance film is in contact with the lower electrodes/wirings in the opening.

Preferably, in the variable resistance element structure is a semiconductor device in which the insulating barrier film has one opening and the two or more lower electrodes/wirings are electrically connected.

Furthermore, the variable resistance element structure may be a semiconductor device in which the insulating barrier film may have one opening which is provided above the lower electrodes/wirings, which are independent of each other, and the second electrodes may electrically integrated together between the two variable resistance elements.

In the variable resistance element structure, the insulating barrier film is preferably has one opening so that connections to both of at least two independent lower electrodes/wirings can be made.

Preferably, a rectifying element is provided on the second electrode and a third electrode is provided on the upper surface of the rectifying element.

<Third Aspect: Materials>

In a third aspect of the present invention, the upper solid electrolyte may be made of a film selected from films in which mobile ions can readily drift because there are holes or voids are in the films. For example, the solid electrolyte is preferably made of at least any material selected from SiOCH, TaSiO$_x$, TaO$_x$, ZrO$_x$, HfO$_x$, SiO$_x$, TiO$_x$ and organic polymer films.

In the semiconductor device, the lower electrodes/wirings are preferably made of copper and the insulating barrier film is preferably made of any material selected from SiC, SiCN, and SiN.

The second electrodes are preferably electrodes that are inactive to metallic ions moving through the solid electrolyte and may be made of a material such as Ru or Pt. Especially preferably, the second electrodes are made of metal composed mostly of Ru and, if mobile ions are copper ions, preferably made of a material such as RuTi or RuTa which can prevent diffusion of copper from a copper metal bridge formed.

The rectifying element may be a film such as a Poole-Frenkel insulating film, a Schottky insulating film, or a threshold-switching volatile variable resistance film. For example, the rectifying element may be a film including any one selected from titanium oxide (TiO$_x$), tantalum oxide (TaO$_x$), tungsten oxide (WO$_x$), molybdenum oxide (MoO$_x$), hafnium oxide (HfO$_x$), aluminum oxide (AlO$_x$), zirconium oxide (ZrO$_x$), yttrium oxide (Y$_2$O$_3$), manganese oxide (MnO$_x$), niobium oxide (NbO$_x$), silicon nitride film (SiN), silicon nitrogen carbide film (SiCN), and silicon oxide film (SiO$_x$). Alternatively, the rectifying element may be a stacked layer of any of these films. The composition and structure of these films may be adjusted to have good rectifying characteristics.

The third electrode is preferably made of a material selected from Ta, Ti, TaN, TiN, W, and Al.

<Fourth Aspect: Fabrication Method>

In a fourth aspect of the present invention, a method for fabricating a semiconductor device including bipolar variable resistance elements inside a multilevel-wiring layer on a semiconductor substrate includes a step of forming an insulating barrier film on a lower-layer wiring in the multilayer-wiring layer and a step of forming a hard mask having an opening pattern on the insulating barrier film. The semiconductor device fabrication method preferably further includes a step of forming an opening in the insulating barrier film that communicates with the wiring and has a tapered wall surface that becomes wider with distance from the wiring by reactive dry etching of the insulating barrier film exposed in the opening pattern using the hard mask as a mask and a step of forming the variable resistance film, the second electrode, the rectifying element, and the third electrode.

Processing of the stacked-layer film is preferably dry etching of the variable resistance film, the second electrode, the rectifying element, and the third electrode performed at the same time.

In the step of forming the opening in the insulating barrier film in the method for fabricating the semiconductor device, preferably one opening that leads to both of two different lower-layer wirings is formed.

In the method for fabricating the semiconductor device, preferably another wiring that does not functions as the lower electrode in the variable resistance film is formed at the same time in the step of forming the wiring, and another plug is formed on the other wiring in the step of forming the plug.

First Exemplary Embodiment

Figure 3:
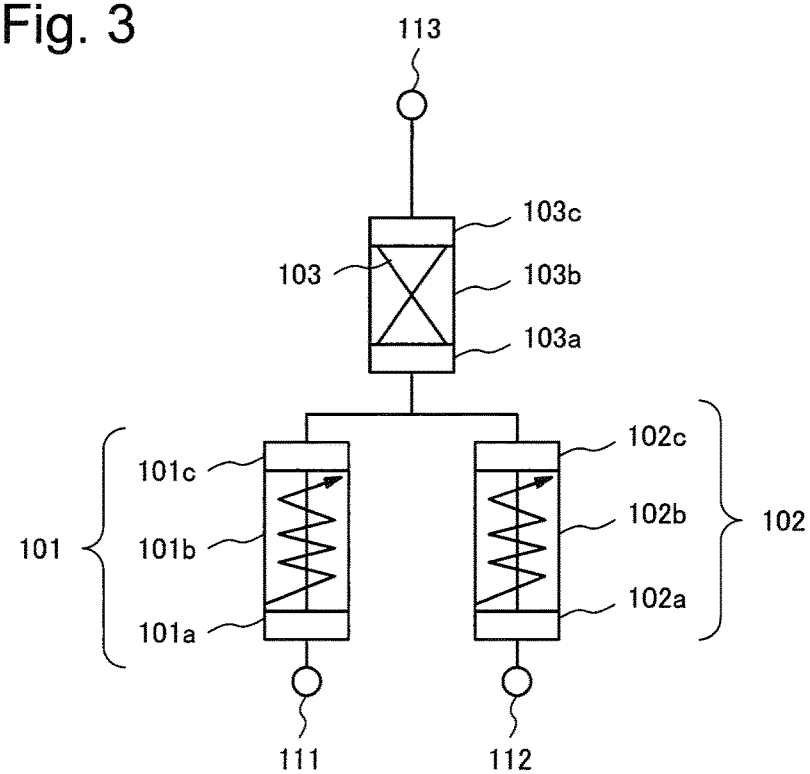
FIG. 3 is an equivalent circuit diagram illustrating a configuration of the switching element according to the first exemplary embodiment of the present invention in further detail.

As illustrated in FIG. 3, in a switching element, a first variable resistance element 101 includes a first electrode 101a, a first variable resistance film 101b and a second electrode 101c, and a second variable resistance element 102 includes a first electrode 102a, a second variable resistance film 102b and a second electrode 102c. A rectifier 103 includes a first electrode 103a, a rectifying film 103b and a second electrode 103c.

Each of the first electrodes 101a, 102a includes an active electrode which supplies metallic ions. The variable resistance films 101b, 102b include a solid electrolyte layer which conducts ionized metal. Each of the second electrodes 101c, 102c includes an inactive electrode that does not react with the metallic ions.

The rectifying film 103b may be a film such as Poole-Frenkel insulating film, a Schottky insulating film, or a threshold-switching volatile variable resistance film.

Next, a factor that minimizes false writes and false operations according to this exemplary embodiment will be described. In this exemplary embodiment of the present invention, the first variable resistance element 101 and the second variable resistance element 102 are insulated and separated from the terminal 113 by the rectifying element 103. The terminal 113 is a programing terminal for programing the first variable resistance element 101 and the second variable resistance element 102. When a voltage less than or equal to a threshold voltage (V2) of the rectifying element is applied, the insulation and separation is maintained regardless of the resistance state of the first variable resistance element 101 and the second variable resistance element 103. In other words, false operations in transmission of signals from the terminal 111 to the terminal 112 do not occur.

Next, a factor that minimizes false operations due to disturbance failure according to this exemplary embodiment will be described. Disturbance failure is erroneous transition from the off state to the on state due to a false operation. Suppose that the first variable resistance element 101 and the second variable resistance element 102 are in a high resistance state. Suppose here that a positive voltage less than or equal to a threshold voltage (set voltage) is applied to the input terminal 111 while the output terminal 112 is grounded. The voltage is applied across the variable resistance element and, while the voltage is applied to the first resistance element 101 in the direction that causes a transition from the off state to the on state, the voltage is applied to the second variable resistance element 102 in the direction that causes a transition from the on state to the off state. In other words, since the voltage is applied to the first variable resistance element 101 in the direction that causes a transition to the on state, a false operation can occur to cause a transition to the on state when a voltage less than or equal to the threshold voltage is applied. However, the voltage applied to the second variable resistance element 102 is in the direction that causes a transition to the off state, such a false operation does not occur.

On the other hand, suppose that a positive voltage less than or equal to the threshold voltage (set voltage) is applied to the output terminal 112 while the input terminal 111 is grounded. While the voltage is applied to the second variable resistance element 102 in the direction that causes a transition from the off state to the on state, the voltage is applied to the first variable resistance element 101 in the direction that causes a transition from the on state to the off state. In other words, since the voltage is applied to the second variable resistance element 102 in the direction that causes a transition to the on state, a false operation can occur to cause a transition to the on state when a voltage less than or equal to the threshold voltage is applied. On the other hand, the voltage applied to the first variable resistance element 101 is in the direction that causes a transition to the off state, such a false operation does not occur.

To block a signal from the input terminal 111 to the output terminal 112 when a signal in either mode is input, it is only need to keep at least one of the first variable resistance element and the second variable resistance element in the off state. According to this exemplary embodiment, therefore, false operations as a switching circuit can be prevented. The use of such variable resistance elements can prevent failure due to false operations of a semiconductor circuit to implement a reliable semiconductor device. Since a voltage further applied is divided between the first variable resistance element and the second variable resistance element, the level of voltage applied to each variable resistance element is small in effect. This effect also alleviates disturbance failures.

An electrical element in which at least two bipolar variable resistance elements are provided, electrodes of the same polarity of the variable resistance elements and the rectifying element are interconnected, and input and output is performed through two unconnected electrodes as illustrated in FIG. 3 is referred to as a complementary variable resistance element with rectifying element.

Second Exemplary Embodiment

Figure 4:
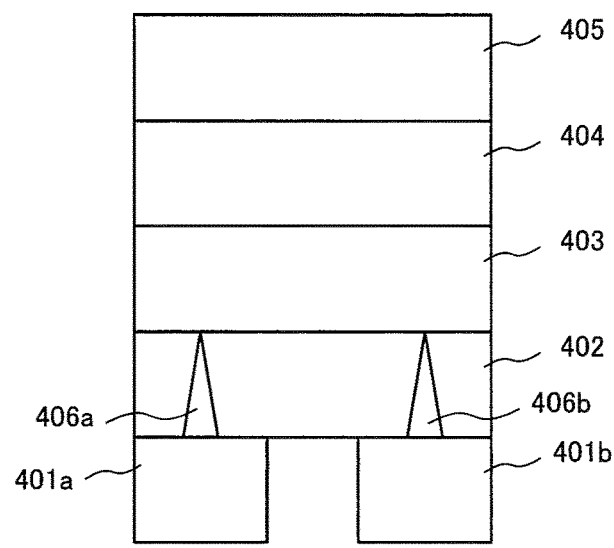
FIG. 4 is a cross-sectional view of an exemplary configuration of a switching element according to a second exemplary embodiment of the present invention.

FIG. 4 illustrates a device structure in which inactive electrodes are interconnected. The device structure includes two bipolar solid electrolyte switches, and solid electrolytes 402 of variable resistance elements described above are interconnected each other, inactive electrodes 403 of the variable resistance elements are interconnected each other, rectifying elements 404 are interconnected each other, control electrodes (third electrodes) 405 are interconnected each other. Signals are input and output through two first electrodes (a first active electrode 401a, a second active electrode 401b) that are not interconnected.

To place the switching element in the on state (low-resistance state), a voltage is applied to the control electrode (third electrode) 405 to form metal bridges 406a, 406b from the first active electrode 401a and the second active electrode 401b, respectively, in the solid electrolyte 402. As a result, the first active electrode 401, the inactive electrode 403 and the second active electrode 401b are electrically interconnected.

Since at this point the control electrode (third electrode) 405 is insulated and separated from the inactive electrode by the rectifying element 404 as in the first exemplary embodiment, the control electrode (third electrode) 405 is separated regardless of the connection between the active electrodes and the inactive electrode.

Third Exemplary Embodiment

A third exemplary embodiment of the present invention will be described next. In the third exemplary embodiment, variable resistance elements (of the first exemplary embodiment) each including a control electrode (third electrode) are arranged in an array and used as a switch (crossbar switch), thereby the switch element area can be reduced.

Figure 5:
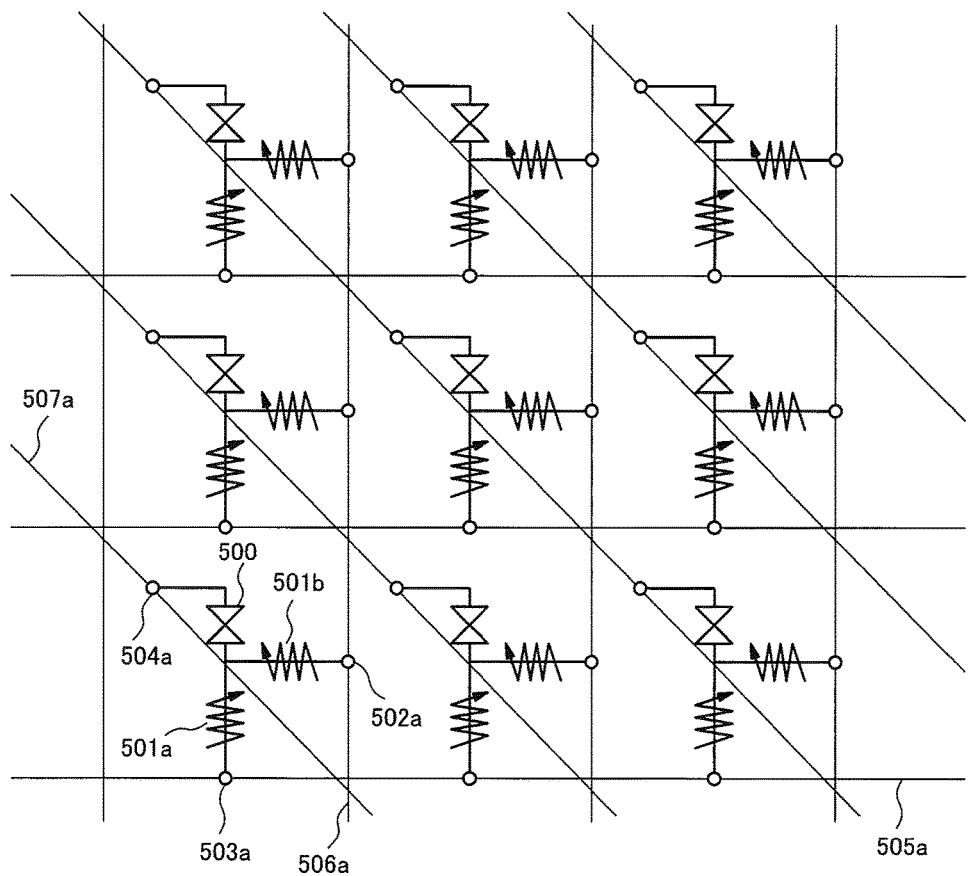
FIG. 5 is a circuit diagram illustrating a crossbar switch using switching elements according to a third exemplary embodiment of the present invention.

FIG. 5 is a diagram illustrating a configuration of the third exemplary embodiment. A configuration in which variable resistance elements are arranged in an array to form a crossbar switch is illustrated in FIG. 5 as an equivalent circuit.

Complementary variable resistance elements achieve an improved reliability against disturbance when the complementary variable resistance elements are place in the off state, because: (1) voltage is divided between two variable resistance elements and (2) bipolar variable resistance elements are connected in series in different set voltage directions, as illustrated in FIG. 5. Furthermore, the controllability of programing can be further improved by adding a control terminal via the rectifying element.

Referring to FIG. 5, terminals 503a and 502a connected to first electrodes of a variable resistance element 501a and a variable resistance element 501b, respectively, are connected to a horizontal line 505a and a vertical line 506a.

Second electrodes of the variable resistance elements 501a, 501b are connected in common, and are connected to one terminal of a rectifying element 500. The other terminal 504a of the rectifying element 500 is a control terminal, which is connected to a diagonal line 507a. In other words, the rectifying element 500 and the variable resistance elements 501a, 501b are located near the intersection of the horizontal line 505a, the vertical line 506a, and the diagonal line 507a.

With the assumption that all of the variable resistance elements are in the off state, programming for placing an intersection of the crossbar in the on state by placing both of the variable resistance elements 501a and 501b in the on state will be described.

First, to place the variable resistance element 501a in the on state, (1) a set voltage is applied to the horizontal line 505a and a voltage that is half the set voltage is applied to the other horizontal lines, (2) all of the vertical lines are placed in a floating state, and (3) the diagonal line 507a is maintained at a ground potential and a voltage that is half the set voltage is applied to the other diagonal lines.

By applying the voltages described above, the set voltage is applied between the first electrode and the control electrode (third electrode) of only the variable resistance element 501a to enable programing. The variable resistance elements that are not selected are not programmed to place in the on state because a voltage that is only up to half the set voltage is applied to the variable resistance elements that are not selected.

Then, to place the variable resistance element 501b in the on state, (1) the set voltage is applied to the vertical line 506a and a voltage that is half the set voltage is applied to the other vertical lines, (2) all of the horizontal lines are placed in the floating state, and (3) the diagonal line 507a is maintained at the ground voltage and a voltage half the set voltage is applied to the other diagonal lines.

By voltage application as described above, the set voltage is applied between the first electrode and the control electrode (third electrode) of only the variable resistance element 501b to enable programing.

By placing both of the variable resistance elements 501a, 501b in the on state in this way, the vertical line 506a and the horizontal line 505a can be connected.

Fourth Exemplary Embodiment

A fourth exemplary embodiment of the present invention will be described next. By sharing diagonal line in the configuration of the crossbar switch of the third exemplary embodiment, the number of programing drivers connected to the diagonal lines, and therefore the dimensions of the crossbar switch, can be reduced.

Figure 6:
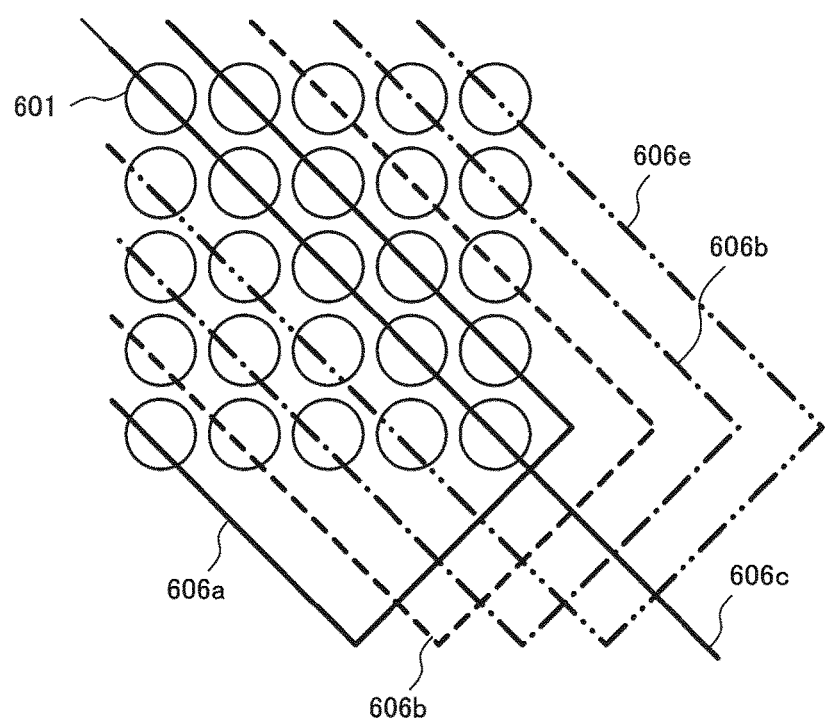
FIG. 6 is a schematic diagram for describing a mode of application to a crossbar switch where diagonal lines are shared.

FIG. 6 is a diagram describing a form of application to a crossbar switch in which diagonal line sharing is implemented. In FIG. 6, 5×5 variable resistance elements 601 are arranged in a matrix. Five diagonal lines 606a-606e are arranged, each of which is connected to five variable resistance elements. Only one of the connected variable resistance elements is connected in each low/column. In other words, in an n×n crossbar switch, the area occupied by diagonal lines used in the crossbar switch can be reduced using a configuration including n diagonal lines each of which is connected to n variable resistance elements.

<Semiconductor Device Manufacturing Method>

A semiconductor device manufacturing method according to an example of the present invention is a method for manufacturing a semiconductor device including variable resistance elements inside a multilevel-wiring layer on a semiconductor substrate. The method includes a step of forming a variable resistance film, a second electrode, a rectifying element, and a third electrode on a wiring that also serves as a lower electrode in this order and a step of forming an upper wiring on the third electrode.

First Example

Figure 7:
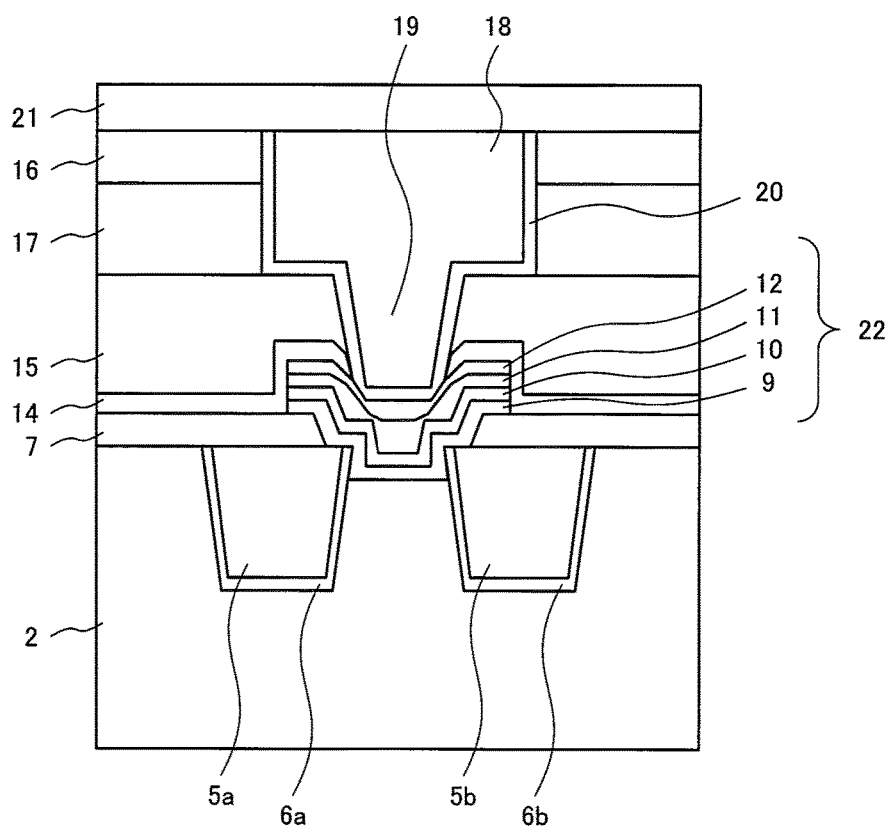
FIG. 7 is a cross-sectional view of an exemplary configuration of a semiconductor device according to an example of the present invention.
Figure 8:
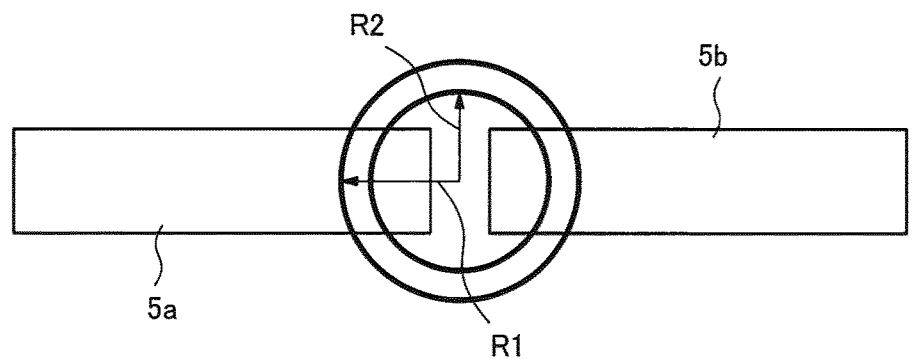
FIG. 8 is a plan view of an exemplary configuration of a semiconductor device according to an example of the present invention.
Figure 9:
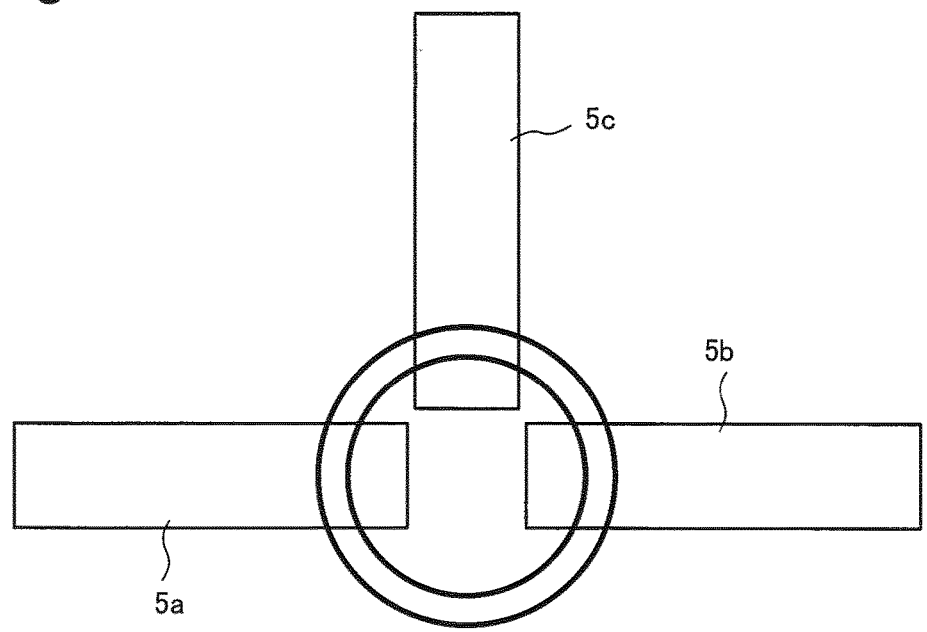
FIG. 9 is a plan view of another exemplary configuration of a semiconductor device according to an example of the present invention.

A semiconductor device according to a first example of the present invention will be described with reference to drawings. FIG. 7 is a partial cross-sectional view schematically illustrating a configuration of a semiconductor device according to an example of the present invention. FIG. 8 is a plan view illustrating an exemplary configuration of the semiconductor device according to the example of the present invention. FIG. 9 is a plan view illustrating another exemplary configuration of the semiconductor device according to the example of the present invention.

The semiconductor device according to the example includes a variable resistance element 22 inside a multilevel-wiring layer on a semiconductor substrate. A variable resistance film 9 of the variable resistance element 22 corresponds to the solid electrolyte 402 of the switching element according to the second exemplary embodiment described with reference to FIG. 4 and a second one of a second electrode 10 corresponds to the inactive electrode 403 in FIG. 4. A first wiring 5a and a second one of a first wiring 5b respectively correspond to the second active electrodes 401a, 401b in the switching element according to the second exemplary embodiment described with reference to FIG. 4.

While FIGS. 7 and 8 illustrate a structure of the semiconductor device that corresponds to a circuit configuration in which two variable resistance elements are connected to one rectifying element, the number of variable resistance elements is not limited to this. For example, FIG. 9 illustrates a plan view of a semiconductor device corresponding to a circuit configuration in which three variable resistance elements are connected to one rectifying element. In FIG. 9, a first wiring 5a, a second one of a first wiring 5b and a third one of a first wiring 5c are provided.

As illustrated in FIG. 7, the multilevel-wiring layer includes, on a semiconductor substrate (not illustrated), an insulating multilayer made up of an interlayer insulating film 2, an insulating barrier film 7, a protective insulating film 14, an interlayer insulating film 15, an interlayer insulating film 17, a hard mask film 16, and a barrier insulating film 21 which are stacked in this order. As a multilevel-wiring layer, the first wirings 5a, 5b are embedded in wiring trenches formed in the interlayer insulating film 2 and the insulating barrier film 7 with barrier metals 6a, 6b in between. As another multilayer-wiring layer, a second wiring 18 is embedded in a wiring trench formed in the interlayer insulating film 17 and the hard mask film 16, and a plug 19 is embedded in a lower hole formed in the interlayer film 15 and the protective insulating film 14. The second wiring 18 and the plug 19 are integrated with each other and the side surfaces and the bottom of the second wiring 18 and the plug 19 are covered with a barrier metal 20.

First wirings 5a, 5b, which will serve as lower electrodes, are formed in an opening formed in the insulating barrier film 7. A variable resistance film 9, a second electrode 10, a rectifying element 11 and a control electrode (third electrode) 12 are stacked on the wall surface of the opening in the insulating barrier film 7 and on the insulating barrier film 7 in this order to form a complementary variable resistance element 22 with rectifier element. The protective insulating film 14 is formed on the control electrode (third electrode) 12 and the side surfaces of the stacked layer made up of the variable resistance film 9, the second electrode 10, the rectifying element 11, and the control electrode (third electrode) 12 are covered with the protective insulating film 14. Since the first wirings 5a, 5b are used as lower electrodes of the variable resistance element 22, i.e. the first wirings 5a, 5b also serve as lower electrodes of the variable resistance element 22, process steps can be simplified while decreasing the electrode resistance. The variable resistance elements can be provided merely by adding the step of forming at least two mask sets to the conventional Cu damascene wiring process. Thus, reduction of resistance and costs of elements can be achieved at the same time.

The complementary variable resistance element 22 with rectifying element is a variable resistance nonvolatile element and may be a switching element that makes use of metal ion migration in an ion conductor and electrochemical reaction as described in the exemplary embodiments described above. The variable resistance element 22 has a configuration including the rectifying element 11 disposed between the first wirings 5a, 5b, which serve as lower electrodes, the control electrode (third electrode) 12 electrically connected to the plug 19 and the second electrode 10. The variable resistance film 9 of the variable resistance element 22 is in direct contact with the first wirings 5a, 5b in regions of the opening formed in the insulating barrier film 7 and the plug 19 and the control electrode (third electrode) 12 are electrically interconnected on the second electrode 10 through the barrier metal 20. The variable resistance element 22 controls on/off by applying a voltage or current. For example, the variable resistance element 22 uses electro-diffusion of metal of the first wirings 5a, 5b into the variable resistance film 9 to control on/off.

The semiconductor substrate, not illustrated, is a substrate on which semiconductor elements are formed. The semiconductor substrate may be a silicon substrate, a single-crystal substrate, an SOI (Silicon on Insulator) substrate, a TFT (Thin Film Transistor) substrate, a substrate for liquid-crystal fabrication, or the like, for example.

The interlayer insulating film 2 is an insulating film formed on the semiconductor substrate. The interlayer insulating film 2 may be for example a silicon oxide film, a low-permittivity film (for example a SiOCH film) that has a specific permittivity lower than a silicon oxide film, or the like. The interlayer insulator film 2 may be a film made of a plurality of insulating films stacked on top of each other.

The insulating barrier film 7 is an insulating film formed on the interlayer insulating film 2. The insulating barrier film 7 may be for example a silicon oxide film, a low-permittivity film (for example a SiOCH film) that has a specific permittivity lower than a silicon oxide film, or the like. The interlayer barrier film 7 may be a film made of a plurality of insulating films stacked on top of each other. Wiring trenches for embedding the first wirings are formed in the interlayer insulating film 2, and the first wirings 5a, 5b are embedded in the wiring trenches with barrier metals 6a, 6b in between.

The first wirings 5a, 5b are wirings embedded in the wiring trenches formed in the interlayer insulating film 2 and the insulating barrier film 7 with the barrier metals 6a, 6b in between. The first wirings 5a, 5b also serve as the lower electrodes of the variable resistance element 22 and are in direct contact with the variable resistance film 9. Note that an electrode layer or other layer may be inserted between the first wirings 5a, 5b and the variable resistance film 9. If an electrode layer is formed, the electrode layer and the variable resistance film 9 are deposited in successive steps and processed in successive steps. The lower part of the variable resistance film 9 is not connected to a lower-layer wiring through a contact plug. The first wirings 5a, 5b are made of metal which can be diffused and whose ions can be conducted in the variable resistance layer 9, and may be made of metal such as Cu, for example. The first wirings 5a, 5b may be made of an alloy with Al.

The barrier metals 6a, 6b are conducting films that have barrier properties and cover the side surfaces and bottom surfaces of the wirings to prevent diffusion of metal from the first wirings 5a, 5b into the interlayer insulating film 2 and an underlying layer. The barrier metals 6a, 6b may be a refractory metal, a nitride thereof or the like such as tantalum (Ta), tantalum nitride (TaN), titanium nitride (TiN) or tungsten carbonitride (WCN), or a stacked film thereof, for example, if the first wirings 5a, 5b are made of metal elements composed mostly of Cu.

The insulating barrier film 7 is formed on the interlayer insulating film 2 including the first wirings 5a, 5b, and has the function of preventing oxidization of the metal (for example Cu) of the first wirings 5a, 5b and diffusion of metal from the first wirings 5a, 5b into the interlayer insulating film 15. Furthermore, the insulating barrier film 7 serves as an etching stop layer during processing of the control electrode (third electrode) 12, the rectifying element 11, the second electrode 10 and the variable resistance film 9. The insulating barrier film 7 may be, for example, a SiC film, a SiCN film, a SiN film, or a stacked structure of any of these films. The insulating barrier film 7 is preferably made of the same material as the protective insulating film 14 and the hard mask film 16.

The insulating barrier film 7 has an opening above the first wirings 5a, 5b. In the opening in the insulating barrier film 7, the first wirings 5a, 5b are in contact with variable resistance film 9. The opening in the insulating barrier film 7 is formed within the regions of the first wirings 5a, 5b. In this way, the variable resistance element 22 can be formed on the substantially even surfaces of the first wirings 5a, 5b. The wall surface of the opening in the insulating barrier film 7 may be tapered surfaces that become wider with distance from the first electrodes 5a, 5b. The tapered surface of the opening in the insulating barrier film 7 is set so that the angle between the upper surface of the first wirings 5a, 5b and the wall surface of the opening is 85° or less. This can alleviate electric field concentration on the outer circumference of the connection between each of the first wirings 5a, 5b and the variable resistance film 9 (near the outer circumference of each opening in the insulating barrier film 7) and improve the insulation resistance.

The variable resistance film 9 is a film whose resistance varies. For the variable resistance film 9, a material whose resistance is changed by an action of metal (such as diffusion or ion conduction) of the first wirings 5a, 5b (lower electrodes) may be used. If the resistance of the variable resistance element 22 is changed by metal ion deposition, a film that can conduct ions is used as the variable resistance film 9 and, for example, an oxide insulating film containing Ta, such as a $Ta_2O_5$ film, a TaSiO film or the like, may be used. Alternatively, the variable resistance film 9 may be a stacked-layer structure of $Ta_2O_5$ and TaSiO that are stacked in this order from the bottom. If the variable resistance film 9 having such a stacked-layer structure is used as a solid electrolyte, a bridge made via metallic ions (for example copper ions) formed in the ion conducting layer in a low-resistance state (on state) can be divided by the $Ta_2O_5$ layer. This allows metallic ions to be readily recovered in the off state and therefore switching characteristics can be improved. The variable resistance film 9 is formed on the first wirings 5a, 5b, a tapered surface of the opening in the insulating barrier film 7, and the insulating barrier film 7. In the variable resistance film 9, the outer circumference of the connection between each of the first wirings 5a, 5b and the variable resistance film 9 is disposed at least along the tapered surface of the opening in the insulating barrier film 7.

A lower-layer side electrode that is in direct contact with the variable resistance film 9 out of the second electrode 10 is preferably made of metal that is less easily ionized and less easily diffused and conducted as ions in the variable resistance film 9 than the metal of the first wirings 5a, 5b. For example, Pt, Ru or the like may be used. Alternatively, a material, such as RuTa or RuTi, that is composed mostly of a metal such as Pt or Ru may be used, and Ta or Ti or the like may be inserted at the interface between the second electrode 10 and the rectifying element 11 for controlling a work function.

One surface of the second electrode 10 is in direct contact with the variable resistance film 9 and the other surface is in direct contact with the rectifying element 11. The second electrode 10 may have a stacked-layer structure. For example, the lower-layer side electrode, which are in direct contact with the variable resistance film 9, and the upper-layer side electrode, which are in direct contact with the rectifying element 11, may stacked together to form a stacked-layer structure. For example, the lower-layer side electrode may be made of RuTa and the upper-layer side electrode may be made of Ta. This can prevent Ru from being exposed to an oxygen atmosphere if the rectifying element is made of an oxide.

By taking into the work function between the rectifying element 11 and the second electrode 10, the upper-layer side electrode which is in direct contact with the rectifying element 11 out of the second electrode 10 may be made of Ta, TaN, Ti, TiN or the like.

The rectifying element 11 may be the rectifying film 103b described above and may be a Poole-Frenkel insulating film, a Schottky insulating film, a threshold-switching volatile variable resistance film or the like. For example, the rectifying element may be a film including any one of titanium oxide ($TiO_x$), tantalum oxide ($TaO_x$), tungsten oxide ($WO_x$), molybdenum oxide ($MoO_x$), hafnium oxide ($HfO_x$), aluminum oxide ($AlO_x$), zirconium oxide ($ZrO_x$), yttrium oxide ($Y_2O_3$), manganese oxide ($MnO_x$), niobium oxide ($NbO_x$), silicon nitride film (SiN), silicon nitrogen carbide film (SiCN), and silicon oxide film ($SiO_x$). Alternatively, the rectifying element may be a stacked layer of any of these films.

Since Ta is used for the electrodes, TaO is especially advantageous as compared with other materials used in formation and processing. SiN is commonly used in semiconductor devices and is also advantageous in that SiN can be easily grown and processed by dry etching.

The control electrode (third electrode) 12 may be made of Ta, Ti, W, Al or a nitride of any of these, for example. The control electrode (third electrode) 12 is preferably made of the same material as the barrier metal 20. The control electrode (third electrode) 12 is electrically connected with the plug 19 through the barrier metal 20. As illustrated in FIG. 8, the diameter R2 (or the area) of the region in which the control electrode (third electrode) 12 and the plug 19 (the barrier metal 20, to be exact) are in contact with each other is set to be smaller than the diameter R1 (or the area) of the region in which the first wirings 5a, 5b and the variable resistance film 9 are in contact with each other. This can prevent poor embedding of plating (for example copper plating) in a lower hole which is formed in the interlayer insulating film 15 and serves as a connection between the control electrode (third electrode) 12 and the plug 19, and can prevent occurrence of voids.

The protective insulating film 14 and the insulating barrier film 7 are preferably made of the same material. This is because by surrounding the variable resistance element 22 entirely by the same material, the material interface can be integrated to prevent penetration of water and the like from the outside and also prevent elimination from the variable resistance element 22.

The protective insulating film 14 is an insulating film that has the functions of preventing damage to the variable resistance element 22 and further preventing elimination of oxygen from the variable resistance film 9. The protective insulating film 14 may be a SiN film, SiCN film or the like, for example. The protective insulating film 14 is preferably made of the same material as the hard mask film 16 and the insulating barrier film 7. If made of the same material, the protective insulating film 14 is integrated with the insulating barrier film 7 and the hard mask film 16 to improve the adhesiveness at the interface, thereby enhancing protection of the variable resistance element 22.

The interlayer insulating film 15 is an insulating film formed on the protective insulating film 14. The interlayer insulating film 15 may be for example a silicon oxide film ($SiO_x$), a SiOC film, or a low-permittivity film (for example a SiOCH film) that has a lower specific permittivity than a silicon oxide film. The interlayer insulating film 15 may be a stacked layer of a plurality of insulating films. The interlayer insulating film 15 may be made of the same material as the interlayer insulating film 17. A lower hole for embedding the plug 19 is formed in the interlayer insulating film 15 and the plug 19 is embedded in the lower hole with barrier metal 20 in between.

The interlay insulating film 17 may be for example a silicon oxide film, a SiOC film, a low-permittivity film (for example a SiOCH film) that has a lower specific permittivity than a silicon oxide film, or the like. The interlayer insulating film 17 may be a stacked layer of a plurality of insulating films. The interlayer insulating film 17 may be made of the same material as the material of the interlayer insulating film 15. A wiring trench for embedding the second wiring 18 is formed in the interlayer insulating film 17 and the second wiring 18 is embodied in the wiring trench with barrier metal 20 in between.

The second wiring 18 is a wiring embedded in the wiring trench formed in the interlayer insulating film 17 with the barrier metal 20 in between. The second wiring 18 is integrated with the plug 19. The plug 19 is embedded in a lower hole formed in the interlayer insulating film 15, the protective insulating film 14 and the hard mask film 16 with the barrier 20 metal in between. The plug 19 is electrically connected with the second electrode 10 through the rectifying element 11. The second wiring 18 and the plug 19 may be made of Cu, for example.

The barrier metal 20 is a conductive film that has a barrier property and covers the side surfaces and the bottom surfaces of the second wiring 18 and the plug 19 in order to prevent diffusion of metal from the second wiring 18 (including the plug 19) into the interlayer insulating films 15, 17 and the underlying layer. The barrier metal 20 may be a refractory metal or a nitride thereof such as tantalum (Ta), tantalum nitride (TaN), titanium nitride (TiN), or tungsten carbonitride (WCN), or a stacked film thereof, for example, if the second wiring 18 and the plug 19 are made of metal elements composed mostly of Cu. The barrier metal 20 preferably contains the same material as the control electrode (third electrode) 12. For example, if the barrier metal 20 has a stacked-layer structure of TaN (lower layer)/Ta (upper layer), the material of the lower layer, TaN, is preferably used for the control electrode (third electrode) 12. Alternatively, if the barrier metal 20 is Ti (lower layer)/Ru (upper layer), the material of the lower layer, Ti, is preferably used for the second electrode 10.

The barrier insulating film 21 is formed on the interlayer insulating film 17 including the second wiring 18, and servers as an insulating film that prevents oxidization of the metal (for example Cu) forming the second wiring 18 and prevents diffusion of metal from the second wiring 18 into the upper layer. The barrier insulating film 21 may be a SiC film, a SiCN film, a SiN film or a stacked-layer structure of any of these films, for example.

Second Example

FIG. 9 is a top view of a variable resistance element in a second example. A complementary variable resistance element 22 with rectifying element 22 is formed on one first wiring 5a and another first wiring 5b, which will serve as lower electrodes, in an opening formed in an insulating barrier layer by stacking a variable resistance film, an upper electrode, a rectifying element, and a control electrode (third electrode) in this order. As has been described above, the diameter R2 (or the area) of the region in which the control electrode (third electrode) and the plug (the barrier metal, to be exact) are in contact with each other is set to be smaller than the diameter R1 (or the area) of the region in which each of the first wirings 5a, 5b and the variable resistance film are in contact with each other.

Figure 10:
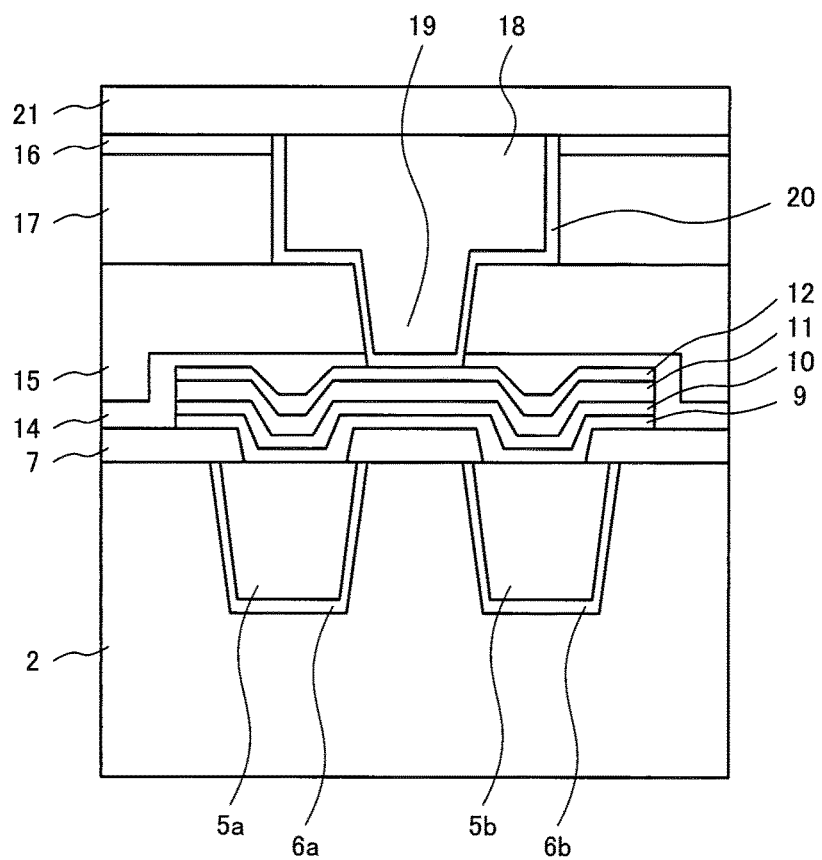
FIG. 10 is a cross-sectional view of another exemplary configuration of a semiconductor device according to an example of the present invention.

FIG. 10 illustrates a variation of a variable resistance element according to a third exemplary embodiment. The variation differs from the device in FIG. 7 which includes the variable resistance element 22 inside the multilevel-wiring layer on the semiconductor substrate in that the variation includes two openings in an insulating barrier film 7.

Specifically, two openings are formed in the insulating barrier film 7 in such a manner that the openings are aligned with first wirings 5a, 5b, which will serve as lower electrodes. A complementary variable resistance element with rectifying element 22 is formed on the wall surfaces of the two openings in the insulating barrier film 7 and on the insulating barrier film 7 by stacking a variable resistance film 9, a second electrode 10, a rectifying element 11 and a control electrode (third electrode) 12 in this order. A plug 19 is embedded in a lower hole formed in an interlayer insulating film 15 and a protective insulating film 14. The lower hole formed in the protective insulating film 14 is located between the two openings in the insulating barrier film 7 as viewed from the top. The plug 19 and the control electrode (third electrode) 12 are electrically connected with each other on the second electrode 10 through barrier metal 20.

Next, a method for fabricating a semiconductor device according to the third exemplary embodiment of the present invention will be described below with reference to drawings. The fabrication method of this exemplary embodiment is an example for forming a semiconductor device of the present invention. FIGS. 11A-11C, 12A-12C, 13A-13C, 14A and 14B are cross-sectional views schematically illustrating a process of a method for fabricating a semiconductor device of the present invention.

First, an interlayer insulating film 2 (for example a silicon oxide film with a film thickness of 500 nm) is deposited on a semiconductor substrate (for example a substrate on which a semiconductor element is formed). Then, wiring trenches are formed in the interlayer insulating film 2 by lithography (including photoresist formation, dry etching and photoresist removal). Then first wirings 5 (for example copper) are embedded in each of the wiring trenches with barrier metal 6 (for example TaN/Ta with a film thickness of 5 nm/5 nm) in between (step A1; see FIG. 11A).

At step A1, the interlayer insulating film 2 can be formed by plasma-enhanced CVD. The plasma-enhanced CVD (Chemical Vapor Deposition) is a method for forming a continuous film on a substrate by continuously supplying a gaseous raw material or a vaporized liquid raw material to a reaction chamber under reduced pressure to excite molecules by plasma energy to cause vapor phase reaction or substrate surface reaction.

At step A1, for example, a barrier metal 6 (for example a TaN/Ta stacked film) is formed by PVD (Physical Vapor Deposition), a Cu seed layer is formed by PVD, and then the wiring trenches are filled with copper by electrolytic plating. Heat treatment is performed at a temperature higher than or equal to 200° C., and then excessive copper is removed from the regions excluding the regions inside the wiring trenches by CMP to form first wirings 5. Such a sequence of copper wiring formation method may be any of methods commonly used in the technical field. The CMP (Chemical Mechanical Polishing) is a method for planarizing a surface of a wafer having unevenness produced during a multilevel-wiring formation process by polishing the surface pressed against a rotating polishing pad while providing slurry onto the surface of the wafer. Planarization is performing by polishing excessive copper embedded in the trenches to form embedded wirings (damascene wirings) or polishing the interlayer insulating film for planarizing.

Figure 11A:
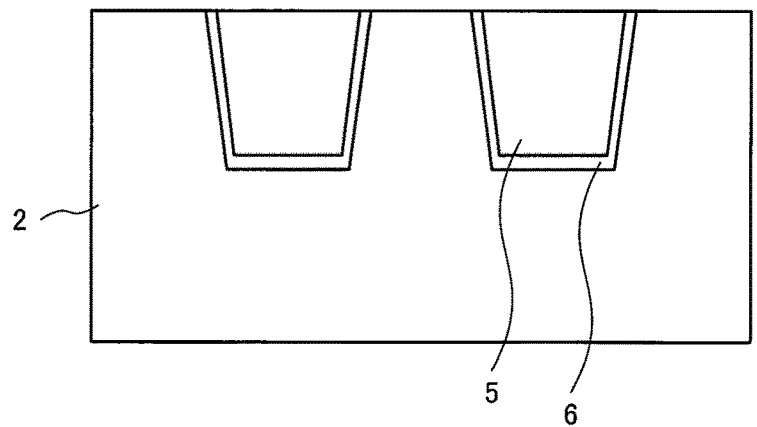
FIG. 11A is a cross-sectional view for describing a method for fabricating a semiconductor device according to an example of the present invention.
Figure 11B:
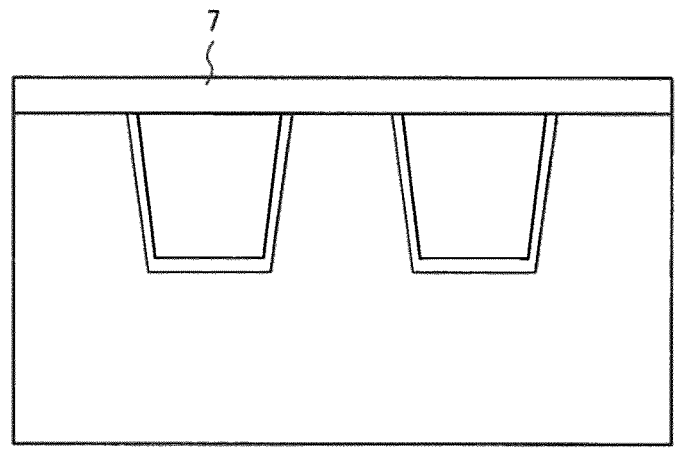
FIG. 11B is a cross-sectional view for describing a method for fabricating a semiconductor device according to an example of the present invention.

Then an insulating barrier film 7 (for example a SiCN film with a film thickness of 30 nm) is formed on the interlayer insulating film 2 including the first wirings 5 (step A2; see FIG. 11B). The insulating barrier film 7 can be formed by plasma-enhanced CVD. The film thickness of the insulating barrier film 7 is preferably in the range of approximately 10 nm to approximately 50 nm.

Figure 11C:
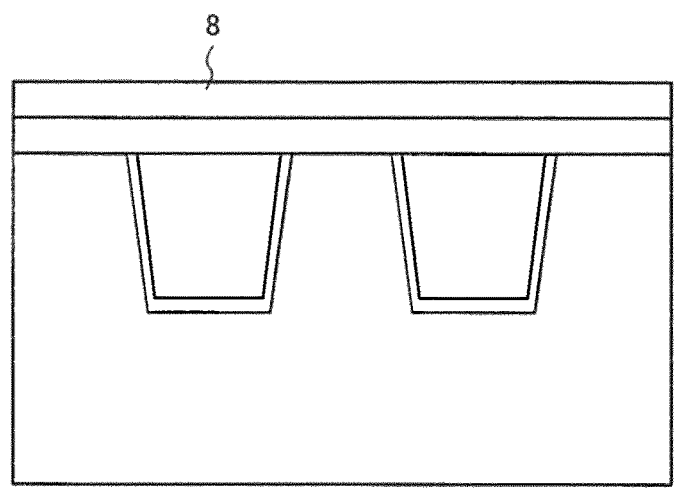
FIG. 11C is a cross-sectional view for describing a method for fabricating a semiconductor device according to an example of the present invention.

Then a hard mask film 8 (for example a silicon oxide film) is formed on the insulating barrier film 7 (step A3; see FIG. 11C). The hard mask film 8 is preferably made of a material different from the material of the insulating barrier film 7 in order to keeping a high etching selectivity in the dry etching process, and may be an insulating film or a conductive film. The hard mask film 8 may be, for example, a silicon oxide film, a silicon nitride film, a TiN, Ti, Ta or TaN or the like, and may be a stacked layer of $SiN/SiO_2$.

Then a photoresist (not illustrated) is applied on the hard mask film 8 to pattern an opening. The photoresist is used as a mask to perform dry etching to form an opening pattern in the hard mask film 8 and then the photoresist is removed by oxygen plasma ashing or the like (step A4; see FIG. 12A). The dry etching does not necessarily need to stop at the upper surface of the insulating barrier film 7 but instead may reach into the insulating barrier film 7.

Figure 12A:
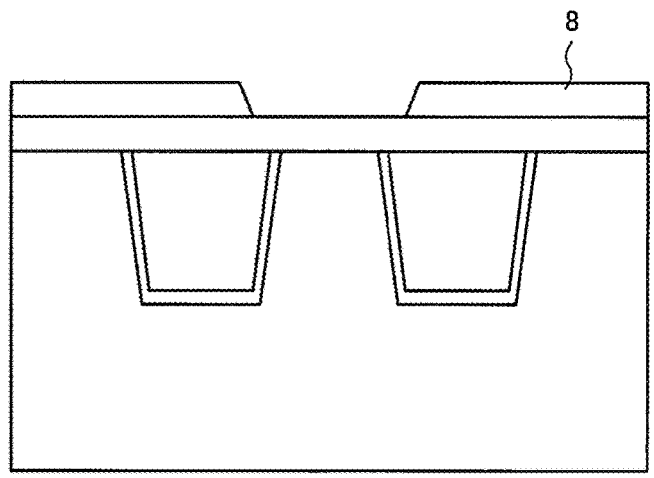
FIG. 12A is a cross-sectional view for describing a method for fabricating a semiconductor device according to an example of the present invention.
Figure 12B:
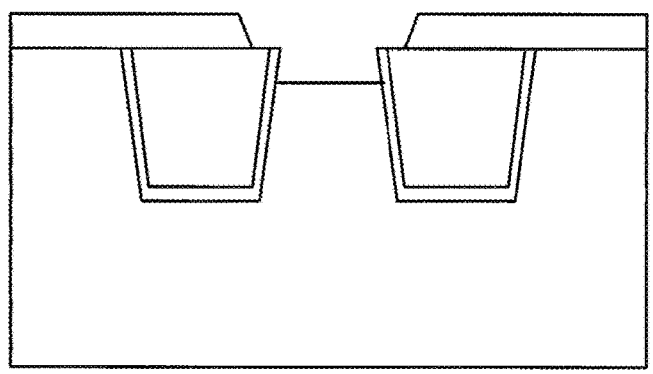
FIG. 12B is a cross-sectional view for describing a method for fabricating a semiconductor device according to an example of the present invention.

Then the hard mask film 8 in which the opening illustrated in FIG. 12A is patterned is used as a mask to etch back (dry etch) the insulating barrier film 7 exposed in the opening in the hard mask film 8. By the etchback, an opening is formed in the insulating barrier film 7 to expose the first wirings 5 in the opening in the insulating barrier film 7. The opening may reach into the interlayer insulating film. Then organic removal processing is performed using an amine-based removal agent or the like to remove copper oxide formed on exposed surfaces of the first wirings 5 and remove the etching by-products and the like generated during the etchback (step A5; see FIG. 12B).

While the hard mask film 8 shown in FIG. 12A is preferably completely removed during the etchback at step A5, the hard mask 8 may remain if the hard mask 8 is made of an insulating material. The shape of the opening in the insulating barrier film 7 may be circular, square, or rectangular, and the diameter of the circle or the length of a side of the square or rectangle may be in the range of 20 nm to 500 nm.

Furthermore, in the etchback of the insulating barrier film 7 at step A5, reactive dry etching can be used to taper the wall surface of the opening in the insulating barrier film 7. In the reactive dry etching, a gas containing fluorocarbon can be used as an etching gas.

Figure 12C:
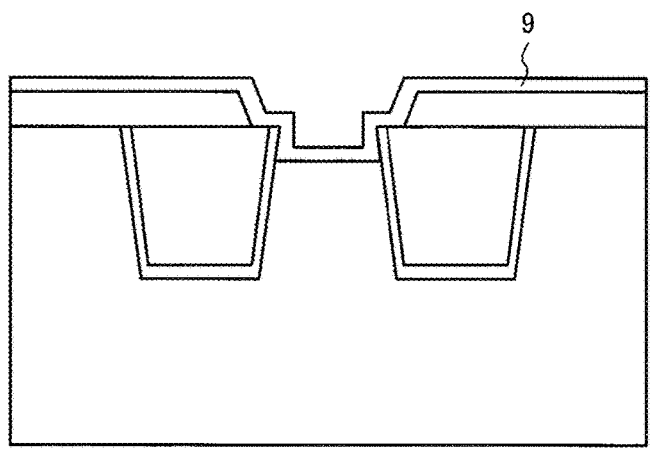
FIG. 12C is a cross-sectional view for describing a method for fabricating a semiconductor device according to an example of the present invention.

Then a variable resistance film 9 (for example a $Si_1C_3O_1$, TaSiO, $Ta_2O_5$, ZrO or HfO film with a film thickness of 6 nm) is deposited on the insulating barrier film 7 including the first wirings 5 (step A7; see FIG. 12C). The variable resistance film 9 can be formed by PVD or CVD.

Since water or the like is attached to the opening in the insulating barrier layer 7 due to the organic removal processing at step A5, thermal processing is preferably applied to degasify under reduced pressure at a temperature in the range of approximately 250° C. to approximately 350° C. at step A7 before depositing the variable resistance film 9. In this case, care needs to be taken, such as producing and maintaining a vacuum or a nitrogen atmosphere, in order to prevent reoxidization of the surface of copper.

Furthermore, gas cleaning or plasma cleaning of the first wirings 5 exposed in the opening in the insulating barrier film 7 may be performed using $H_2$ gas at step A7 before depositing the variable resistance film 9. This can inhibit oxidization of the first wirings 5 (Cu) during the formation of the variable resistance film 9 and inhibit thermal diffusion (material transfer) of copper during the process.

Furthermore, at step A7, a thin film of Ti (not illustrated) may be deposited (to a thickness less than or equal to 2 nm) by PVD before depositing the variable resistance film 9 to inhibit oxidization of the first wirings 5 (Cu). The thin-film Ti layer is oxidized to become titanium oxide during the formation of the variable resistance film 9.

If a variable resistance film using a transition metal oxide (such as TiO or NiO, for example) is used as the variable resistance film 9 instead of a variable resistance film using a solid electrolyte, a second lower electrode (not illustrated, which corresponds to 5a in FIG. 8) may be formed at step A7 before depositing the variable resistance film 9. The second lower electrode may be made of, for example, Ti, TiN, W, WN, Ta, TaN, Ru, $RuO_x$ or the like and may be, for example, a stacked structure of any of these (for example a TaN (lower layer)/Ru (upper layer) stacked layer). In this case, the total thickness of the stacked-layer structure needs to be thinner than the insulating barrier layer 7 and is preferably less than or equal to 10 nm in order to reduce element unevenness and surface roughness since the variable resistance element 9 is formed inside a via interlayer insulating film.

Furthermore, since the variable resistance film 9 needs to be embedded in uneven opening with a good coverage, preferably plasma-enhanced CVD is used at step A7.

Then, a second electrode 10 of a stacked-layer structure is formed on the variable resistance film 9. A lower-layer side electrode (for example Ru with a film thickness of 10 nm) that will be in direct contact with the variable resistance film 9 and an upper-layer side electrode (for example Ta with a film thickness of 50 nm) are formed in this order. In order to embed the electrode in the opening, which is uneven, without causing voids, preferably ALD (Atomic Layer Deposition), for example, is used to form Ru. Then a rectifying element 11 and a control electrode (third electrode) 12 are formed in this order (step A8; see FIG. 13A).

A first hard mask film (for example a SiN film with a film thickness of 30 nm) and a second hard mask film (for example a SiO$_2$ film with a film thickness of 200 nm) are stacked in this order on the control electrode (third electrode) 12. The first hard mask film and the second hard mask film can be formed by plasma-enhanced CVD. The hard mask films can be formed by plasma-enhanced CVD commonly used in the technical field. The first hard mask film and the second hard mask film are preferably of different types; for example, the first hard mask film may be a SiN film and the second hard mask film may be a SiO$_2$ film. In this case, the first hard mask film is preferably made of the same material as the protective insulating film 14 and the insulating barrier film 7. This is because by surrounding the variable resistance element entirely by the same material, the material interface can be integrated to prevent penetration of water and the like from the outside and also prevent elimination from the variable resistance element. Furthermore, the first hard mask film can be formed by plasma-enhanced CVD, which requires that the first hard mask is maintained under reduced pressure in a reaction chamber before forming the film, which causes problems that oxygen is eliminated from the variable resistance film 9 and oxygen failure increases leak current of the solid electrolyte. To alleviate the problems, the film is formed at a temperature of 350° C. or lower, preferably 250° C. or lower. Moreover, since there is exposure to a deposition gas under reduced pressure before film formation, it is preferable not to use a reducing gas. For example, a SiN film formed from a mixed gas of SiH$_4$/N$_2$ by using high-density plasma is preferably used.

Then, a photoresist (not illustrated) for patterning a variable resistance element portion is formed on the second hard mask film, and then the photoresist is used as a mask to dry etch the second hard mask film until the first hard mask film appears. Then oxygen plasma ashing and organic removal are used to remove the photoresist.

Then, the second hard mask film is used as a mask to continuously dry etch the first hard mask film, the control electrode (third electrode) 12, the rectifying element 11, the second electrode 10, and the variable resistance film 9. While the hard mask film is preferably completely removed during etch back, the hard mask film may remain.

At step A11, if the second electrode 10 is made of Ta, for example, the second electrode 10 can be processed by Cl$_2$-based RIE; if the second electrode 10 is made of Ru, the second electrode 10 can be processed by RIE using a mixed gas of Cl$_2$/O$_2$. In the etching of the variable resistance film 9, the dry etching needs to be stopped on the underlying insulating barrier film 7. If the variable resistance film 9 is an oxide containing Ta and the insulating barrier film 7 is a SiN film or a SiCN film, RIE processing can be performed by adjusting etching conditions using a mixed gas such as a CF$_4$-based gas, a CF$_4$/Cl$_2$-based gas, or a CF$_4$/Cl$_2$/Ar-based gas. By using such hard mask RIE, the variable resistance element portion can be processed without exposing the variable resistance element portion to oxygen plasma ashing for removal of the resist. If oxidization processing is performed using oxygen plasmas after the processing, oxidization plasma processing can be applied without depending on resist removal time.

Figure 13A:
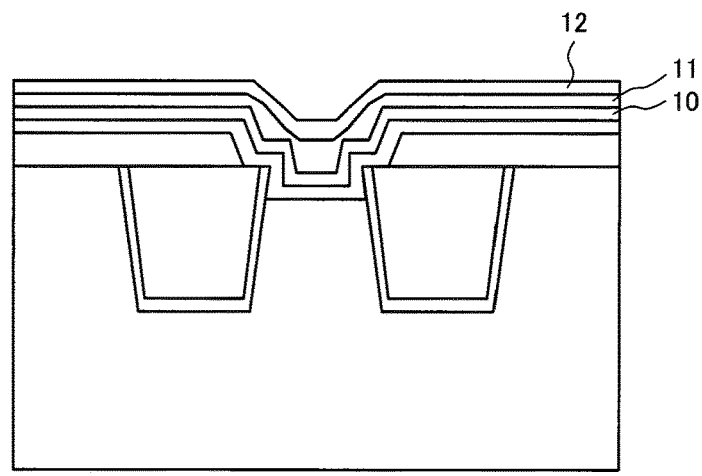
FIG. 13A is a cross-sectional view for describing a method for fabricating a semiconductor device according to an example of the present invention.
Figure 13B:
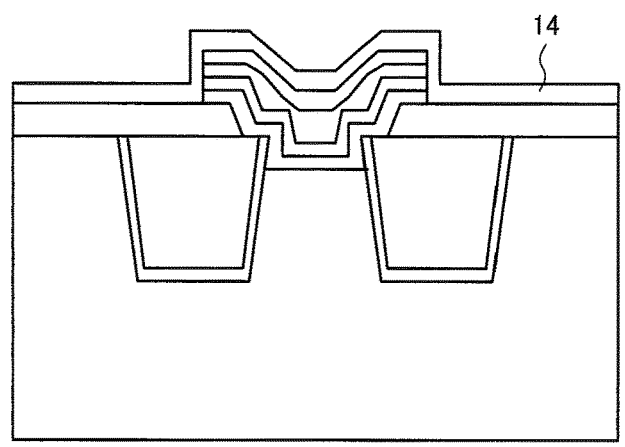
FIG. 13B is a cross-sectional view for describing a method for fabricating a semiconductor device according to an example of the present invention.

Then, a protective insulating film 14 (for example a SiN film with a film thickness of 30 nm) is deposited on the insulating barrier film 7 including the control electrode (third electrode) 12, the rectifying element 11, the second electrode 10, and the variable resistance film 9 (step A12; see FIG. 13B).

At step A12, the protective insulating film 14 can be formed by plasma-enhanced CVD, which requires that the variable resistance film 9 be maintained under reduced pressure in the reaction chamber before forming the film, which may causes problems that oxygen is eliminated from side surfaces of the variable resistance film 9 and leak current of the solid electrolyte may increases. To alleviate the problems, the protective insulating film 14 is preferably formed at a temperature of 250° C. or lower. Moreover, because of exposure to a deposition gas under reduced pressure before film formation, it is preferable not to use a reducing gas. For example, a SiN film formed from a mixed gas of SiH$_4$/N$_2$ by using high-density plasma at a substrate temperature of 200° C. is preferably used.

Figure 13C:
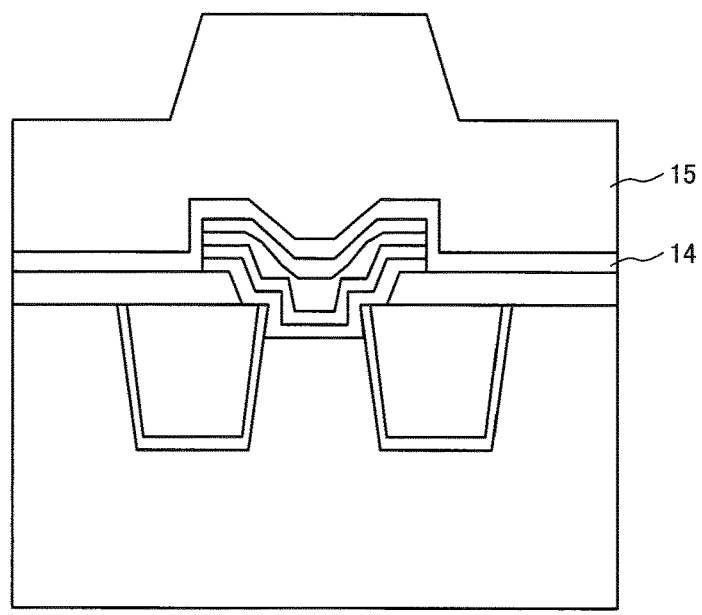
FIG. 13C is a cross-sectional view for describing a method for fabricating a semiconductor device according to an example of the present invention.
Figure 14A:
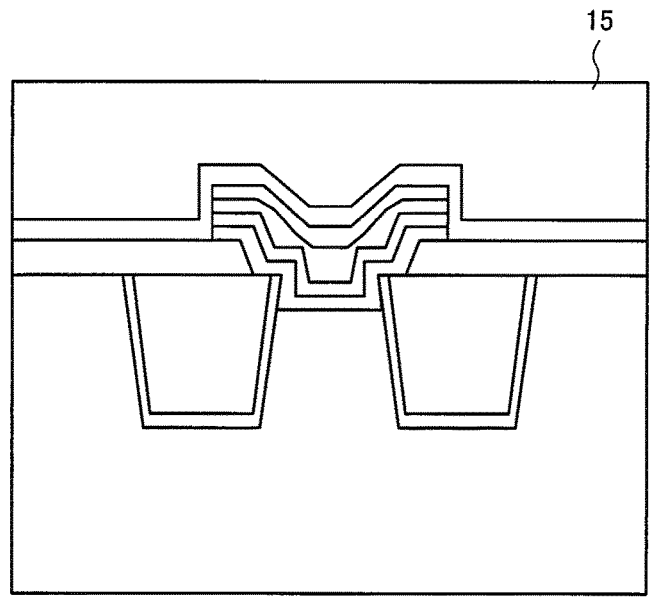
FIG. 14A is a cross-sectional view for describing a method for fabricating a semiconductor device according to an example of the present invention.
Figure 14B:
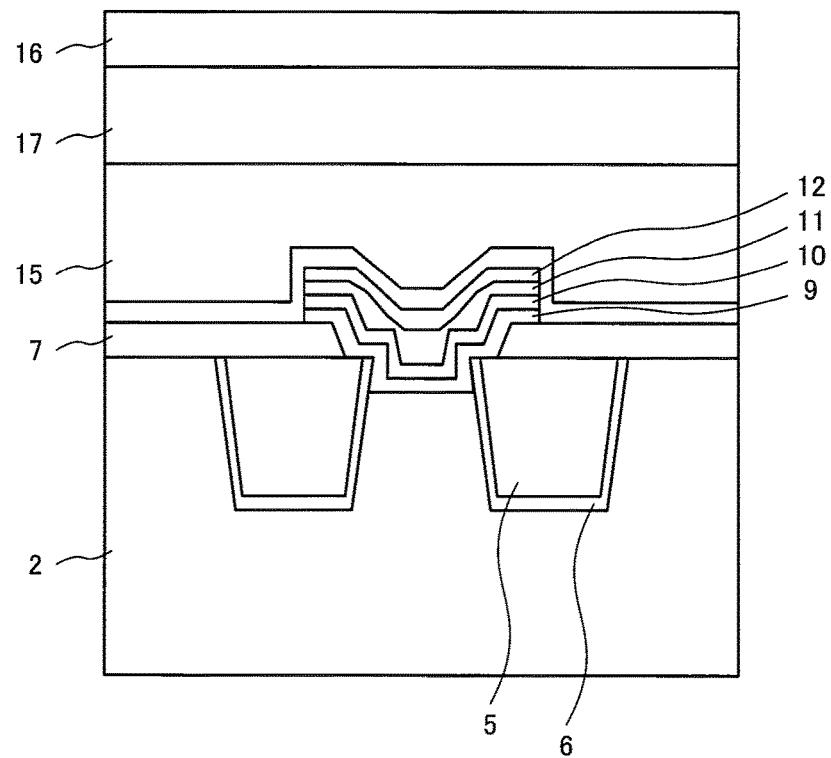
FIG. 14B is a cross-sectional view for describing a method for fabricating a semiconductor device according to an example of the present invention.
Figure 15A:
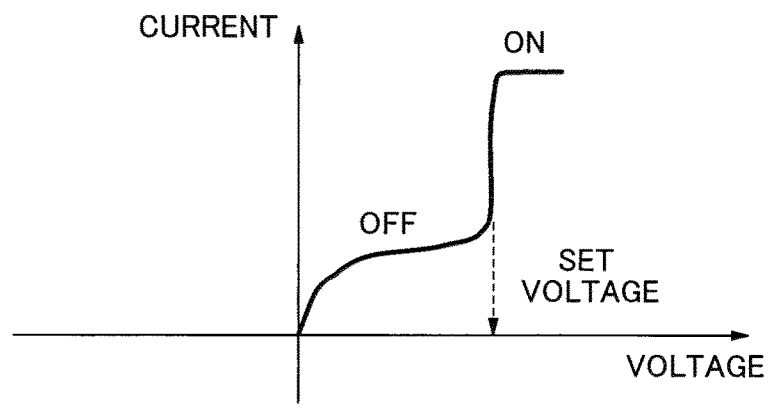
FIG. 15A is a graph illustrating operating characteristics of a unipolar variable resistance element.
Figure 15B:
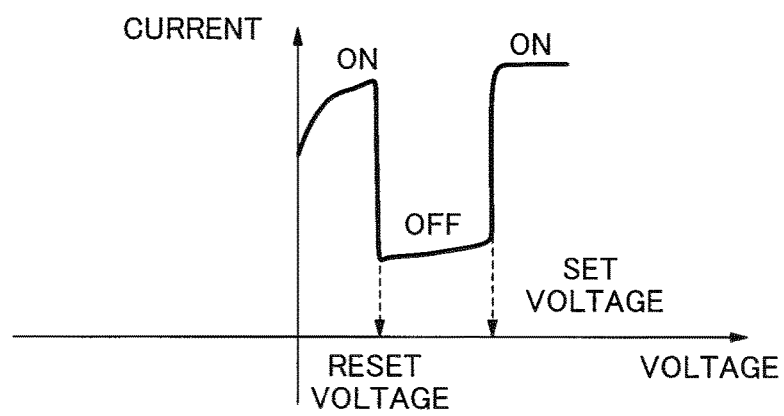
FIG. 15B is a graph illustrating operating characteristics of a unipolar variable resistance element.
Figure 15C:
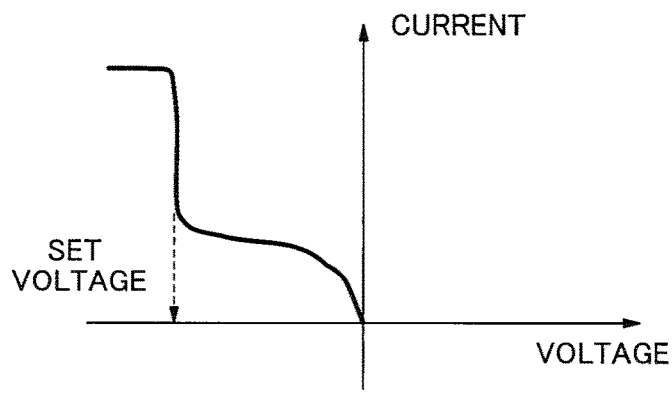
FIG. 15C is a graph illustrating operating characteristics of a unipolar variable resistance element.
Figure 15D:
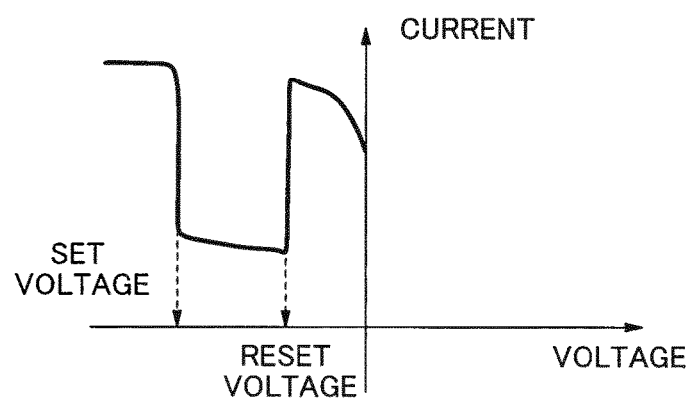
FIG. 15D is a graph illustrating operating characteristics of a unipolar variable resistance element.
Figure 16A:
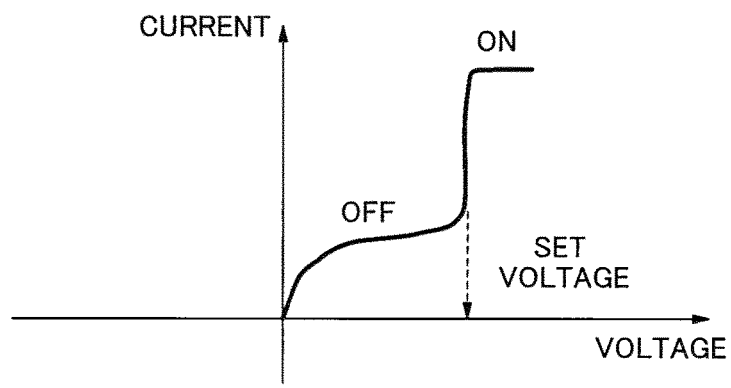
FIG. 16A is a graph illustrating operating characteristics of a bipolar variable resistance element.
Figure 16B:
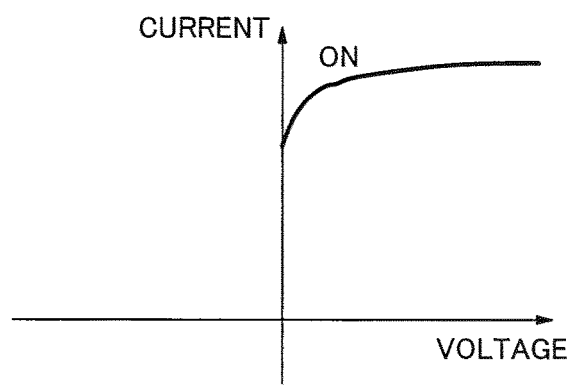
FIG. 16B is a graph illustrating operating characteristics of a bipolar variable resistance element.
Figure 16C:
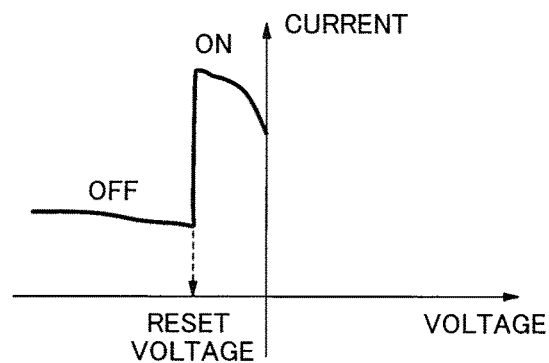
FIG. 16C is a graph illustrating operating characteristics of a bipolar variable resistance element.
Figure 16D:
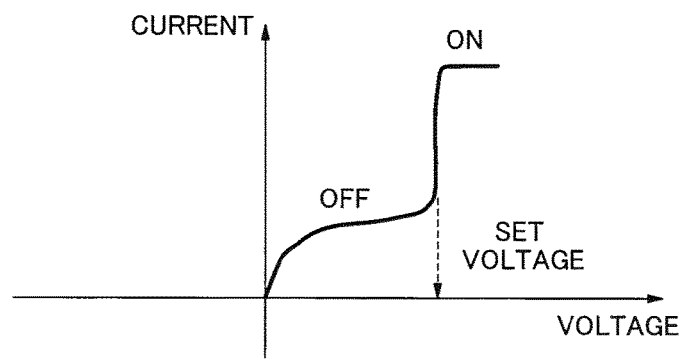
FIG. 16D is a graph illustrating operating characteristics of a bipolar variable resistance element.

Then an interlayer insulating film 15 (for example SiOC) is formed on the protective insulating film 14 as illustrated in FIG. 13C, and then the interlayer insulating film 15 is polished by CMP to planarize the interlayer insulating film 15 as illustrated in FIG. 14A. Furthermore, an interlayer insulating film 17 (for example a silicon oxide film) and a hard mask film 16 are deposited on the interlayer insulating film 15 in this order as illustrated in FIG. 14B.

Then, a wiring trench for a second wiring 18 and a lower hole for a plug 19 are formed and a copper dual damascene wiring process is used to form a second wiring 18 (for example Cu) and a plug 19 (for example Cu) in the wiring trench and the lower hole with barrier metal 20 (for example TaN/Ta) in between at the same time. Then a barrier insulating film 21 (for example a SiN film) is deposited on the hard mask film 16 including the second wiring 18 (step A13; see FIG. 7).

The second wiring 18 can be formed at step A13 by using the same process used for forming the lower-layer wirings. In this case, the barrier metal 20 and the control electrode (third electrode) 12 are made of the same material so that the contact resistance between the plug 19 and the control electrode (third electrode) 12 can be reduced and the element performance can be improved (the resistance of the variable resistance element 22 in the on state can be reduced).

Also at step A13, the interlayer insulating film 15 and the interlayer insulating film 17 can be formed by plasma CVD.

Furthermore, at step A13, in order to eliminate unevenness produced by the variable resistance element 22, the interlayer insulating film 15 may be deposited thick and the interlayer insulating film 15 may be polished by CMP to planarize to a desired thickness.

According to the fabrication method, the first wirings 5 are used as lower electrodes of the variable resistance element 22, i.e. the first wirings 5 also serve as the lower electrodes of the variable resistance element 22, to achieve higher density by the size reduction of the variable resistance element 22 and enable formation of a complementary variable resistance element. Accordingly, the reliability can be improved. The rectifying element 11 is formed on the upper surface of the variable resistance element 22 and the variable resistance element 22 can be provided simply by forming two mask sets as an additional step added to a conventional Cu damascene wiring process, and thus cost reduction of the device can be achieved at the same time. Furthermore, the variable resistance element 22 can also be provided inside a state-of-the-art device configured with copper wirings, thereby improving the performance of the device.

In deposition of the variable resistance film 9, a polymer solid electrolyte composed mostly of hydrocarbon can be formed also by plasma-enhanced CVD using a ring organosiloxane raw material illustrated in (Chemical Formula 1) or (Chemical Formula 2) given below. Since the ring organosiloxane material has a three- or four-membered ring Si—O as its skeleton and has unsaturated hydrocarbon as side chains, a solid electrolyte that enables ready formation of a metal bridge with low density can be formed. For example, the ring organosiloxane material shown in (Chemical Formula 1) is introduced into a chamber of a deposition system at a flowrate of 65 sccm and He as the carrier gas is introduced at a flowrate of 500 sccm to deposit a solid electrolyte on a 300-mm substrate under a condition of RF power of 200 W, a substrate temperature of 350° C. and a pressure of 4.5 Torr.

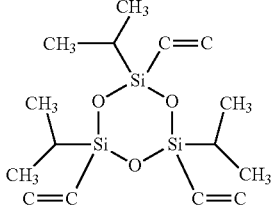

(Chemical Formula 1)

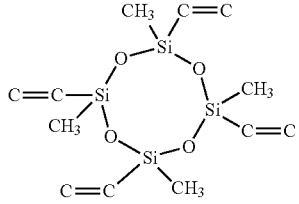

(Chemical Formula 2)

The second electrode 10 can be deposited by DC (Direct Current) sputtering with RuTa as the target under a condition using Ar gas at a DC power of 0.2 kW and 2 mTorr. Similarly, the control electrode (third electrode) 12 can be deposited by DC sputtering with Ta as the target under the same conditions. Since the second electrode 10 and the control electrode (third electrode) 12 are deposited under reduced pressure, the deposition is performed at room temperature in order to inhibit elimination of oxygen from the variable resistance film 9.

Third Example

Figure 17:
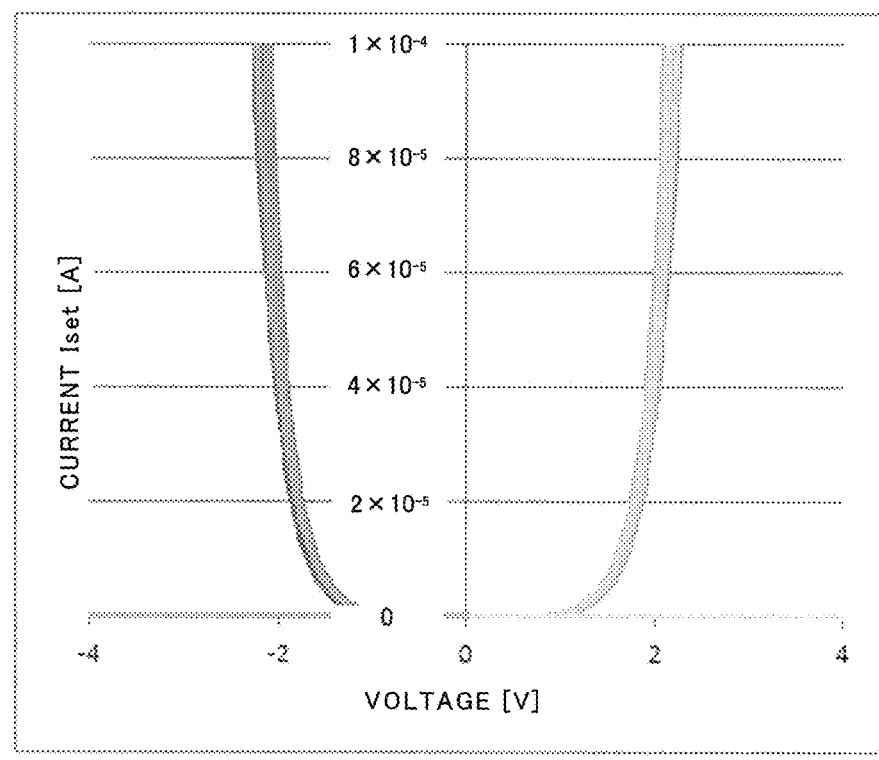
FIG. 17 is a graph illustrating operating characteristics of a rectifying element made of TaO.

FIG. 17 is a graph illustrating voltage-current characteristics of a rectifying element made of TaO. It can be seen that current starts to increase at a voltage exceeding about 1 V. Thus, current does not flow from the rectifying element when a logic signal of less than or equal to 1 V is transmitted. When a programing voltage greater than 1 V is applied, current flows through the rectifying element and therefore the variable resistance element connected in series can be programmed.

Figure 18A:
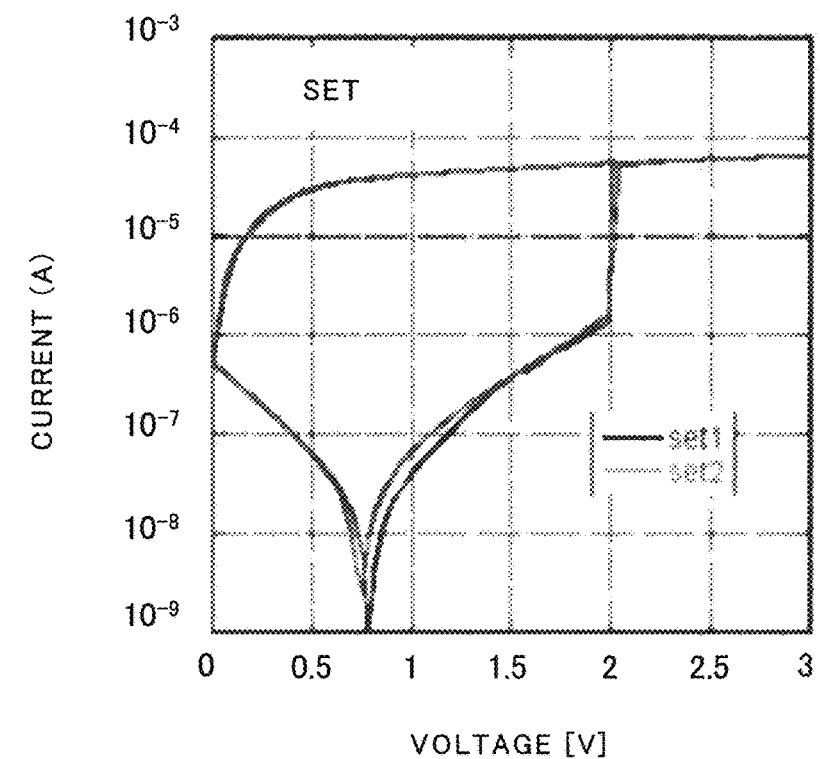
FIG. 18A is a graph illustrating operating characteristics of a semiconductor device according to an example of the present invention.
Figure 18A:
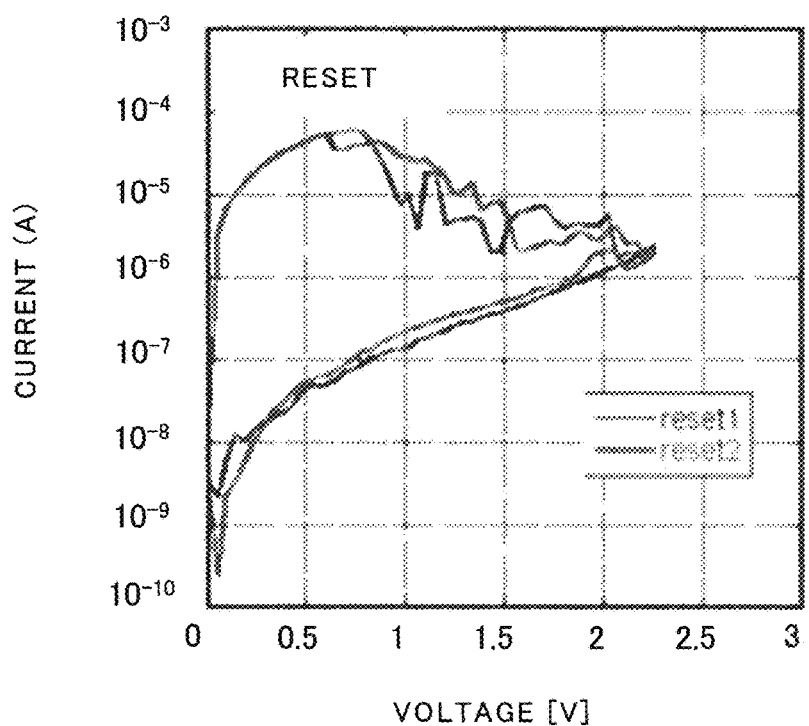
Figure 18B:
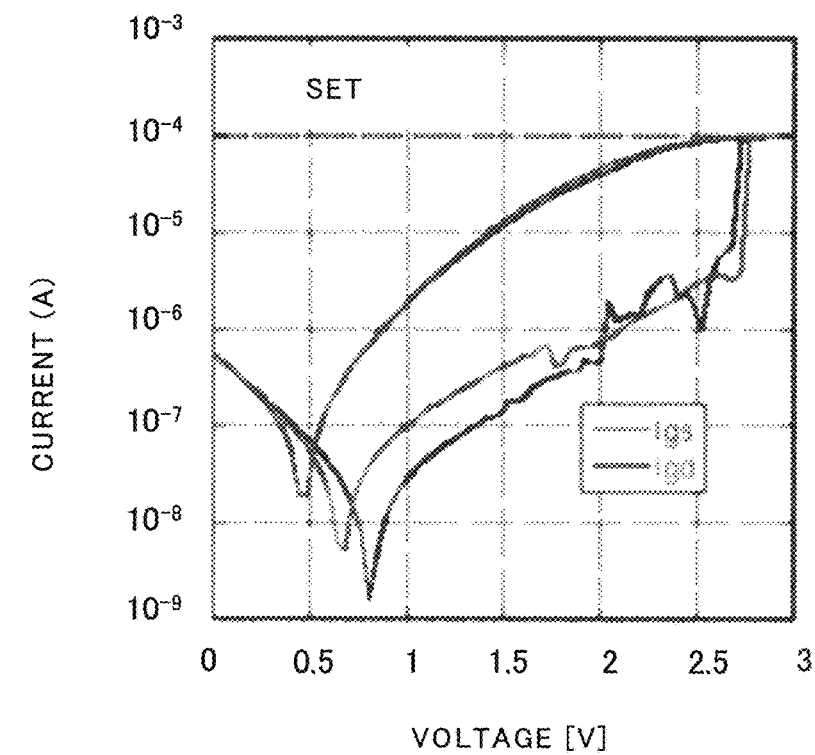
FIG. 18B is a graph illustrating operating characteristics of a semiconductor device according to an example of the present invention.
Figure 18B:
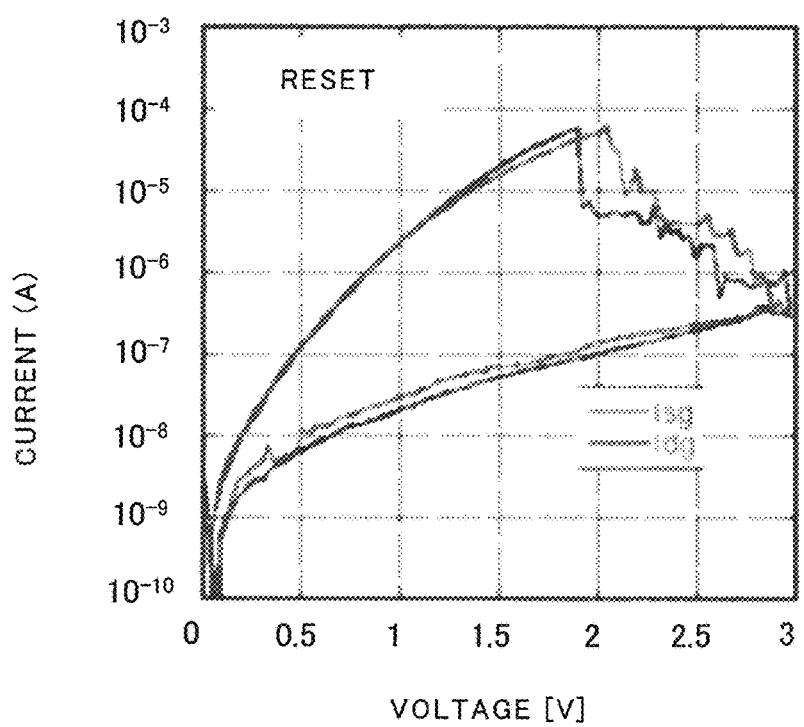

FIGS. 18A and 18B are graphs for illustrating operating characteristics of a semiconductor device according to one example of the present invention. FIG. 18A illustrates programing characteristics of a device experimentally fabricated by using the rectifying element of the first example. In the experimentally fabricated device, copper wirings were used as the lower electrodes/wirings, a 5-nm polymer solid electrolyte was used as the variable resistance element, 5-nm RuTa was used as the second electrode, TaO with a film thickness of 4 nm was used as the rectifying element, and Ta was used as the third electrode. FIG. 18B illustrates programing characteristics of a device experimentally fabricated without using a rectifying element. It can be seen that the switching voltage of the variable resistance element without a rectifying element is 2 V whereas the voltage of the variable resistance element with a rectifying element is about 2.7 V. This can be considered a voltage rise due to the insertion of the rectifying element.

Figure 19A:
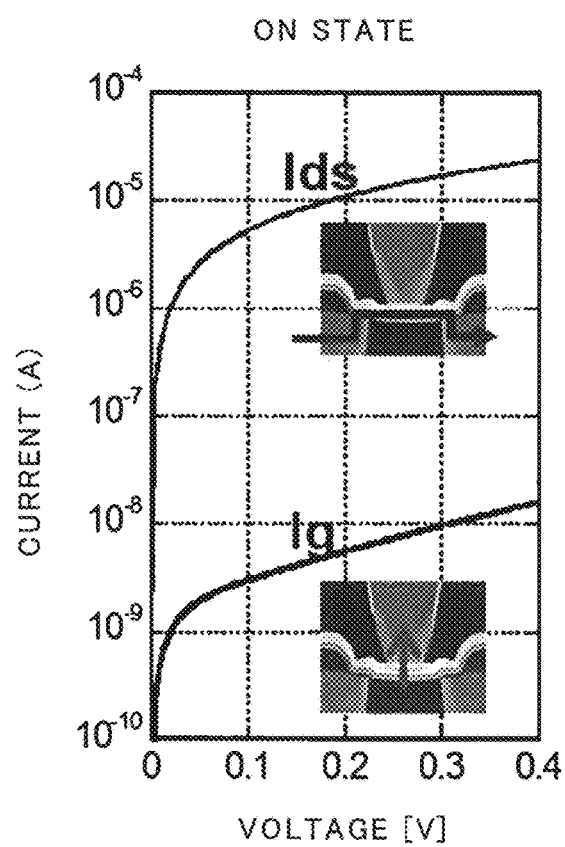
FIG. 19A illustrates photographs of a cross-section of a semiconductor device and a graph illustrating operating characteristics of the semiconductor device according to an example of the present invention.
Figure 19B:
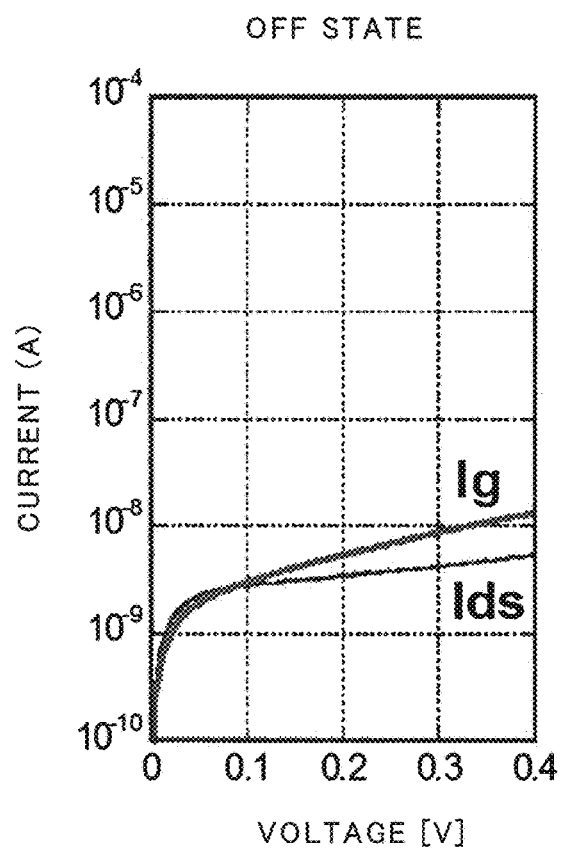
FIG. 19B illustrates photographs of a cross-section of a semiconductor device and a graph illustrating operating characteristics of the semiconductor device according to an example of the present invention.

FIGS. 19A and 19B illustrate voltage-current (Ids) characteristics between first wirings and voltage-current (Ig) characteristics of control terminal-first wiring before and after programming in FIGS. 18A and 18B. It can be seen that Ig is low regardless of the state of conduction between the first wirings. This is because the control terminal is electrically insulated by the rectifying element. On the other hand, it can be seen that current between the first wirings is large in the on state and small in the off state. In other words, it can be seen that the current level is under control by programming of the variable resistance element.

Fourth Example

Figure 20:
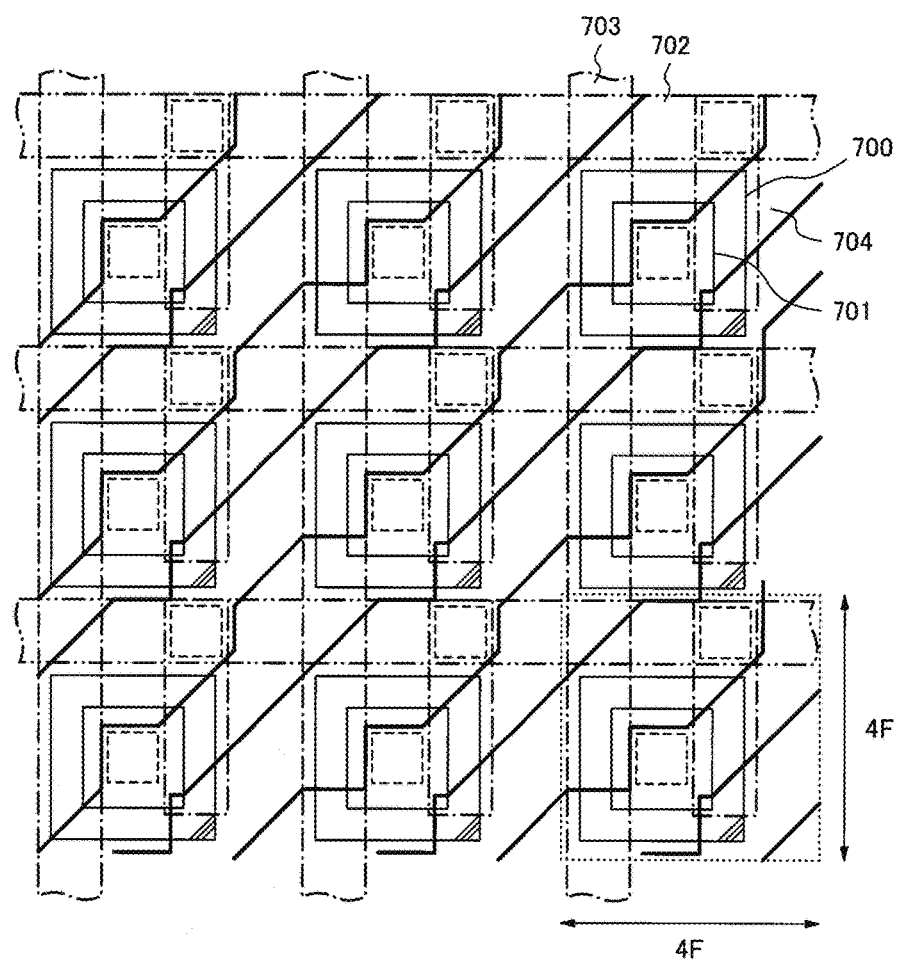
FIG. 20 is a plan view of a layout of a structure of a semiconductor device according to an example of the present invention.

FIG. 20 is a plan view of a layout of a structure of a semiconductor device according to one example of the present invention, and illustrates one example of a real layout of a crossbar switch described in the fourth exemplary embodiment. A 3×3 rectifying elements 700 are arranged in a matrix. This layout is characterized by control lines arranged in diagonal lines 704. It can be seen that by using horizontal lines 703 in the crossbar array as first lower-layer wirings (M4), vertical lines 702 are used as second lower-layer wirings (M3), and diagonal lines 704 are used as upper wirings (M5), cells can be arranged in an array with a size of 16F2 per cell with the 65-nm design rule. In other words, one cell is formed in a 4F×4F region shown in FIG. 20. A feature is that the size of an opening 701 in a barrier insulating film on an M4 wiring is chosen to be greater than the minimum half pitch F, which is defined by the distance between wirings. In other words, a compact layout can be implemented by forming the horizontal lines 703, the vertical lines 702 and the diagonal lines 704 in different wiring layers.

The present invention has been described with respect to several preferred examples, these exemplary embodiments and the examples are for illustrative purposes only and are not intended to limit the present invention.

While a technique to fabricate a semiconductor device including a CMOS (Complementary Metal Oxide Semiconductor) circuit has been described in detail with the exemplary embodiments described above and examples in which variable resistance elements are formed inside a multilevel copper wiring on a semiconductor substrate have been described, the present invention is not limited to these. For example, the present invention is also applicable to cupper wirings of semiconductor products including a memory circuit such as a DRAM (Dynamic Random Access Memory), an SRAM (Static Random Access Memory), a flash memory, an FRAM (registered trademark) (Ferro Electric Random Access Memory), an MRAM (Magnetic Ransom Access Memory), a variable resistance memory, or a bipolar transistor, semiconductor products including a logic circuit such as a microprocessor, or boards or packages on which any of those components are mounted together. Furthermore, the present invention is also applicable to junction of an electronic circuit device, an optical circuit device, a quantum circuit device, a micromachine, MEMS (Micro Electro Mechanical Systems) or the like to a semiconductor device. Moreover, while the present invention has been described mainly with respect to examples in terms of switching function, the present invention is also applicable to memory elements that use non-volatility and variable resistance properties and rectifying elements. While characteristics of metallic ion deposition-based variable resistance elements have been mainly illustrated as examples of resistance variable elements, the operating principle of the variable resistance elements does not limit the application of the present invention.

Furthermore, switching elements according to any of the exemplary embodiments in a completed device can be identified. Specifically, if variable resistance elements are provided inside a multilevel wiring, the switching element can be identified by observing a cross section of a device under a TEM (Transmission Electron Microscope) as follows. The switching element can be identified by observing whether the under surface of the variable resistance element is a copper wiring which also serve as a lower electrode and there is an opening between two different lower-layer wirings, thereby whether a structure described herein is provided can be identified. Furthermore, by performing composition analysis such as EDX (Energy Dispersive X-ray Spectroscopy) or EELS (Electron Energy-Loss Spectroscopy), in addition to TEM, whether or not an element is made of a material described in the present invention can be identified.

The present invention is not limited to the exemplary embodiments and the examples described above but instead various variations are possible within the scope of the present invention defined in the claims and it would be understood that those variations are also fall within the scope of the present invention.

Any or all of the exemplary embodiments described above can be described as in, but not limited to, the following supplementary notes.

(Supplementary Note 1) A switching element including a first variable resistance element including: a first input/output terminal and a first connection terminal; a second variable resistance element including a second input/output terminal and a second connection terminal; and a rectifying element including a control terminal and a third connection terminal, wherein the first connection terminal, the second connection terminal and the third connection terminal are interconnected.

(Supplementary Note 2) The switching element according to Supplementary Note 1, wherein the first variable resistance element, the second variable resistance element and the rectifying element have the same operating polarity.

(Supplementary Note 3) The switching element according to Supplementary Note 1 or 2, wherein the first variable resistance element is configured to transition from a non-conducting state to a conducting state when electric potential at the first input/output terminal is higher than electric potential at the first connection terminal, and transition from the conducting state to the non-conducting state when the electric potential at the first input/output terminal is lower than the electric potential at the first connection terminal; and the second variable resistance element is configured to transition from a non-conducting state to a conducing state when electric potential at the second input/output terminal is higher than electric potential at the second connection terminal, and transition from the conducting state to the non-conducting state when the electric potential at the second input/output terminal is lower than the electric potential at the second connection terminal.

(Supplementary Note 4) The switching element according to any one of Supplementary Notes 1 to 3, wherein each of the first variable resistance element and the second variable resistance element is a nonvolatile variable resistance element including a first electrode, a second electrode and a variable resistance film disposed between the electrodes, the first electrode being an active electrode supplying metallic ions, the variable resistance film is a layer capable of conducting metallic ions, the second electrode being an inactive electrode, and the rectifying element being a volatile variable resistance element.

(Supplementary Note 5) The switching element according to Supplementary Note 1, wherein each of the variable resistance elements is a nonvolatile variable resistance element including a first electrode, a second electrode and a variable resistance film disposed between the electrodes, the first electrode being an active electrode supplying metallic ions, the variable resistance film being a layer capable of conducting metallic ions, and the second electrode being an inactive electrode.

(Supplementary Note 6) The switching element according to Supplementary Note 1, wherein the switching element is configured to be inserted in a signal path, input and output are performed through two unconnected terminals of each of the variable resistance elements, and resistance state of the variable resistance element is controlled with an unconnected terminal of the rectifying element.

(Supplementary Note 7) The switching element according to Supplementary Note 1, wherein the switching element is formed in a multilayer-wiring layer in a semiconductor device, a first electrode serve as both of a lower electrode and a copper wiring, an insulating barrier film is formed on an upper layer of the copper wiring, the insulating barrier layer includes an opening, the variable resistance film is in contact with the lower electrode and the copper wiring in the opening, and a second electrode, a rectifying element and a third electrode are stacked in this order from the bottom on an upper surface of the variable resistance film.

(Supplementary Note 8) The switching element according to Supplementary Note 7, wherein the variable resistance film is in contact with at least two of the lower electrode and the copper wiring in the opening, and the second electrode, the rectifying element and the third electrode are integrated together between two variable resistance elements.

(Supplementary Note 9) The switching element according to Supplementary Note 1, wherein the rectifying element is made of any one of materials including $SiN_x$, $TaO_x$, $NbO_x$, $HfO_x$, $TiO_x$, $ZrO_x$, and $WO_x$ or a stacked layer of one or more of the materials.

(Supplementary Note 10) The switching element according to Supplementary Note 9, wherein the first electrode is composed mainly of Cu, the second electrode is composed mainly of Ru, and the insulating barrier layer is made of SiC, SiCN, or SiN.

(Supplementary Note 11) A semiconductor device including a bipolar variable resistance element in a multilevel copper wiring layer on a semiconductor substrate, the semiconductor device including: a plurality of first electrodes and copper wirings formed in the multilevel copper wiring layer, an insulating barrier film formed on the plurality of first electrodes and copper wirings, an opening formed in the insulating barrier film, the opening being connected with the first electrodes and copper wirings and having a tapered wall surface becoming wider with distance from the copper wiring, a variable resistance film formed on a planar surface including the opening, a second electrode formed on the variable resistance film, a rectifying element formed on the second electrode, and a third electrode formed on the rectifying element.

(Supplementary Note 12) The semiconductor device according to Supplementary Note 11, wherein the third electrode is a control electrode.

(Supplementary Note 13) The semiconductor device according to Supplementary Note 11 or 12, wherein the variable resistance film, the second electrode, the rectifying element and the third electrode form a stacked-layer structure.

(Supplementary Note 14) A method for fabricating a semiconductor switching device including a bipolar variable resistance element in a multilevel copper wiring layer on a semiconductor substrate, the method including the steps of: forming an insulating barrier film on a first electrode and a copper wiring; forming, on the insulating barrier film, an opening communicating with the first electrode and the copper wiring and having a tapered wall surface becoming wider with distance from the copper wiring; forming a variable resistance film on an entire surface including the opening; forming a second electrode on the variable resistance film; forming a rectifying element on the second electrode; and forming a third electrode on the rectifying element.

(Supplementary Note 15) The method for fabricating a semiconductor switching device according to Supplementary Note 14, wherein the variable resistance film, the second electrode, the rectifying element and the third electrode are formed by etching using a common mask.

(Supplementary Note 16) A semiconductor device being a crossbar switch array using the switching element according to any one of Supplementary Notes 1 to 10, wherein a horizontal line is a first lower-layer wiring, a vertical line is a second lower-layer wiring, and a diagonal line connecting to a control terminal is an upper-layer wiring.

REFERENCE SIGNS LIST

2 . . . Interlayer insulating film
5, 5a, 5b . . . First wiring
6, 6a, 6b . . . Barrier metal
7 . . . Insulating barrier film
8 . . . Hard mask film
9 . . . Variable resistance film
10 . . . Second electrode
11 . . . Rectifying element
12 . . . Control electrode (third electrode)
14 . . . Protective insulating film
15 . . . Interlayer insulating film
16 . . . Hard mask film
17 . . . Interlayer insulating film
18 . . . Second wiring
19 . . . Plug
20 . . . Barrier metal
21 . . . Barrier insulating film
101 . . . First variable resistance element
101a . . . First electrode
101b . . . First variable resistance film
101c . . . Second electrode
102 . . . Second variable resistance element
102a . . . First electrode
102b . . . Second variable resistance film
102c . . . Second electrode
103 . . . Rectifying element
103a . . . First electrode
103b . . . Rectifying film
103c . . . Second electrode
111 . . . First terminal
112 . . . Second terminal
113 . . . Third terminal
401a . . . First active electrode
401b . . . Second active electrode
402 . . . Solid electrolyte
403 . . . Inactive electrode
404 . . . Rectifying element
405 . . . Control electrode
406a, 406b . . . Metal bridge
500 . . . Rectifying element
501a, 501b . . . Variable resistance element
502a, 503a, 504a . . . Terminal
505a . . . Horizontal line
506a . . . Vertical line
507a . . . Diagonal line
601 . . . Variable resistance element
606a, 606b, 606c, 606d, 606e . . . Diagonal line
700 . . . Rectifying element
701 . . . Opening
702 . . . Vertical line
703 . . . Horizontal line
704 . . . Diagonal line

The invention claimed is:

1. A switching element comprising:
a first variable resistance element comprising a first input/output terminal and a first connection terminal;
a second variable resistance element comprising a second input/output terminal and a second connection terminal;
a rectifying element comprising a control terminal and a third connection terminal;
a first wiring connected to the first input/output terminal of the first variable resistance element;
a second wiring connected to the second input/output terminal of the second variable resistance element; and
a third wiring connected to the control terminal of the rectifying element, wherein
the first connection terminal, the second connection terminal and the third connection terminal are interconnected,
one of the first wiring and the second wiring overpasses another of the first wiring and the second wiring,
one of the first wiring and the second wiring is a horizontal line commonly connecting a plurality of first input/output terminals of first variable resistance elements, comprising the first variable resistance element, arranged in a horizontal direction,
the another of the first wiring and the second wiring is a vertical line commonly connecting a plurality of second input/output terminals of second variable resistance elements, comprising the second variable resistance element, arranged in a vertical direction,
the third wiring is a diagonal line commonly connecting a plurality of control terminals of rectifying elements, comprising the rectifying element, arranged in a diagonal direction, and has a folded structure comprising another diagonal line commonly connecting at least one of other control terminals of at least one of other rectifying elements arranged in the diagonal direction located differently from the plurality of control terminals of the rectifying elements, and
the third wiring is configured to be connected to a programming line.

2. The switching element according to claim 1, wherein the first variable resistance element, the second variable resistance element and the rectifying element comprise a same operating polarity.

3. The switching element according to claim 1,
wherein the first variable resistance element is configured to transition from a non-conducting state to a conducting state when electric potential at the first input/output terminal is higher than electric potential at the first connection terminal, and transition from the conducting state to the non-conducting state when the electric potential at the first input/output terminal is lower than the electric potential at the first connection terminal; and the second variable resistance element is configured to transition from a non-conducting state to a conducing state when electric potential at the second input/output terminal is higher than electric potential at the second connection terminal, and transition from the conducting state to the non-conducting state when the electric potential at the second input/output terminal is lower than the electric potential at the second connection terminal.

4. The switching element according to claim 1, wherein each of the first variable resistance element and the second variable resistance element is a nonvolatile variable resistance element comprising a first electrode, a second electrode and a variable resistance film disposed between the electrodes, the first electrode being an active electrode supplying metallic ions, the variable resistance film being a layer capable of conducting metallic ions, the second electrode being an inactive electrode; and the rectifying element is a volatile variable resistance element.

5. The switching element according to claim 4, wherein the switching element is formed in a multilayer wiring layer in a semiconductor device, the first electrode serves as both of a lower electrode and a copper wiring, an insulating barrier film is formed on an upper layer surface of the copper wiring, the insulating barrier film comprises an opening, the variable resistance film is in contact with the lower electrode and the copper wiring in the opening, and the second electrode, the rectifying element and a third electrode are stacked in this order from the bottom on an upper surface of the variable resistance film.

6. The switching element according to claim 5, wherein the variable resistance film is in contact with at least two of the lower electrode and the copper wiring in the opening, and the second electrode, the rectifying element and the third electrode are integrated together between the first and the second variable resistance elements.

7. The switching element according to claim 1, wherein the rectifying element is made of any one of materials comprising $SiN_x$, $TaO_x$, $NbO_x$, $HfO_x$, $TiO_x$, $ZrO_x$, and $WO_x$ or a stacked layer of one or more of the materials.

8. The switching element according to claim 5, wherein the first electrode is composed mainly of Cu, the second electrode is composed mainly of Ru, and the insulating barrier film is made of SiC, SiCN, or SiN.

9. A semiconductor device comprising:
a plurality of switching elements arranged in an array, in which each switching element comprise the switching element according to claim 1,
a plurality of horizontal lines, comprising the horizontal line, connected to at least one of the first input/output terminal of the first variable resistance element in the switching elements,
a plurality of vertical lines, comprising the vertical line, connected to at least one of the second input/output terminal of the second variable resistance element in the switching elements, and a plurality of diagonal lines, comprising the diagonal line, connected to at least one of the control terminal of the rectifying element in the switching elements.

10. The switching element according to claim 1, wherein one of the horizontal line, the vertical line and the diagonal line overpasses others of the horizontal line, the vertical line and the diagonal line.

11. The switching element according to claim 1, wherein at least another one of the control terminals interposes between the control terminal and the at least one of other control terminals.

12. A semiconductor device comprising a bipolar variable resistance element in a multilevel copper wiring layer on a semiconductor substrate, the semiconductor device comprising:
a plurality of first electrodes and copper wirings formed in the multilevel copper wiring layer;
an insulating barrier film formed on the plurality of first electrodes and copper wirings;
an opening formed in the insulating barrier film, the opening being connected with the first electrodes and copper wirings and having a tapered wall surface becoming wider with distance from the copper wirings;
a variable resistance film formed on a planar surface having the opening;
a second electrode formed on the variable resistance film;
a rectifying element formed on the second electrode;
a third electrode formed on the rectifying element;
a first wiring connected to one of the plurality of first electrodes and the copper wirings;
a second wiring connected to another one of the plurality of first electrodes and the copper wirings; and
a third wiring connected to the third electrode formed on the rectifying element, wherein
one of the first wiring and the second wiring overpasses another of the first wiring and the second wiring,
one of the first wiring and the second wiring is a horizontal line commonly connecting a plurality of first input/output terminals of first variable resistance elements, comprising a first variable resistance element, arranged in a horizontal direction,
the another of the first wiring and the second wiring is a vertical line commonly connecting a plurality of second input/output terminals of second variable resistance elements, comprising a second variable resistance element, arranged in a vertical direction,
the third wiring is a diagonal line commonly connecting a plurality of control terminals of rectifying elements, comprising the rectifying element, arranged in a diagonal direction, and has a folded structure comprising another diagonal line commonly connecting at least one of other control terminals of at least one of other rectifying elements arranged in another the diagonal direction located differently from the plurality of control terminals of the rectifying elements, and
the third wiring is configured to be connected to a programming line.

13. The semiconductor device according to claim 12, wherein the third electrode is a control electrode.

14. The semiconductor device according to claim 12, wherein the variable resistance film, the second electrode, the rectifying element and the third electrode form a stacked-layer structure.

* * * * *

UNITED STATES PATENT AND TRADEMARK OFFICE
CERTIFICATE OF CORRECTION

PATENT NO. : 10,340,451 B2  
APPLICATION NO. : 14/655920  
DATED : July 2, 2019  
INVENTOR(S) : Munehiro Tada et al.

Page 1 of 1

It is certified that error appears in the above-identified patent and that said Letters Patent is hereby corrected as shown below:

In the Specification

Column 18, Description of Embodiments, Line 64; Delete "A1." and insert --Al.-- therefor In the Claims Column 34, Line 54; In Claim 12, after "in", delete "another"

Signed and Sealed this  
Fifth Day of November, 2019

Andrei Iancu  
*Director of the United States Patent and Trademark Office*